US012660390B2

(12) United States Patent
Wakaki et al.

(10) Patent No.: US 12,660,390 B2
(45) Date of Patent: Jun. 16, 2026

(54) METHOD OF MANUFACTURING BASE MEMBER, METHOD OF MANUFACTURING LIGHT-EMITTING DEVICE, BASE MEMBER, AND LIGHT-EMITTING DEVICE

(71) Applicant: NICHIA CORPORATION, Anan (JP)

(72) Inventors: Takayoshi Wakaki, Anan (JP); Takuo Ota, Anan (JP)

(73) Assignee: NICHIA CORPORATION, Anan (JP)

( * ) Notice: Subject to any disclaimer, the term of this patent is extended or adjusted under 35 U.S.C. 154(b) by 547 days.

(21) Appl. No.: 18/013,245

(22) PCT Filed: Jun. 17, 2021

(86) PCT No.: PCT/JP2021/023048
§ 371 (c)(1),
(2) Date: Dec. 28, 2022

(87) PCT Pub. No.: WO2022/004410
PCT Pub. Date: Jan. 6, 2022

(65) Prior Publication Data
US 2023/0261159 A1 Aug. 17, 2023

(30) Foreign Application Priority Data

Jun. 29, 2020 (JP) ................................. 2020-111819
May 14, 2021 (JP) ................................. 2021-082118

(51) Int. Cl.
*H10H 20/857* (2025.01)
*H10W 90/00* (2026.01)
*H10H 20/01* (2025.01)

(52) U.S. Cl.
CPC .......... *H10H 20/857* (2025.01); *H10W 90/00* (2026.01); *H10H 20/0364* (2025.01)

(58) Field of Classification Search
CPC .............. H10H 20/857; H10H 20/0364; H01L 25/0753; H10W 90/00
See application file for complete search history.

(56) References Cited

U.S. PATENT DOCUMENTS

2003/0113991 A1 6/2003 Maeda
2008/0008427 A1 1/2008 Takeda et al.
(Continued)

FOREIGN PATENT DOCUMENTS

JP 2002-184795 6/2002
JP 2003-007970 1/2003
(Continued)

OTHER PUBLICATIONS

Bashir, Designing of High Reflectance Distributed Bragg reflectors (DBRs), mirrors using AlGaInN material system in the UV wavelength range, University of Gavle, Jun. 2009; Abstract, pp. 5, 36-37, 40, 48-51 (Year: 2009).*

*Primary Examiner* — Jeff W Natalini
*Assistant Examiner* — Ian Isaac Degrasse
(74) *Attorney, Agent, or Firm* — MORI & WARD, LLP

(57) ABSTRACT

A method of manufacturing a base member including preparing a structure including a base having a first surface and a second surface opposite to the first surface, an electrode disposed on the first surface of the base, and an insulating film covering the first surface and the second surface of the base and the electrode. The method further includes exposing the electrode from the insulating film by irradiating the insulating film on the electrode with a laser light.

14 Claims, 18 Drawing Sheets

(56) References Cited

U.S. PATENT DOCUMENTS

| | | |
|---|---|---|
| 2009/0078455 A1 | 3/2009 | Takakusaki et al. |
| 2009/0272562 A1 | 11/2009 | Yoshioka et al. |
| 2009/0272564 A1 | 11/2009 | Yoshioka et al. |
| 2011/0114969 A1 | 5/2011 | Lee et al. |
| 2011/0127549 A1 | 6/2011 | Lee et al. |
| 2011/0247860 A1 | 10/2011 | Yoshioka et al. |
| 2011/0281138 A1 | 11/2011 | Yoshioka et al. |
| 2011/0310914 A1* | 12/2011 | Kaertner ............ H01S 3/08059 |
| | | 372/18 |
| 2012/0055547 A1 | 3/2012 | Schultz-Wittmann et al. |
| 2012/0206891 A1 | 8/2012 | Yoshioka et al. |
| 2012/0285736 A1 | 11/2012 | Yoshioka et al. |
| 2012/0292083 A1 | 11/2012 | Yoshioka et al. |
| 2013/0200522 A1 | 8/2013 | Yoshioka et al. |
| 2013/0203197 A1* | 8/2013 | Tsai ..................... H10K 71/421 |
| | | 438/34 |
| 2014/0087502 A1 | 3/2014 | Lee et al. |
| 2014/0090876 A1 | 4/2014 | Yoshioka et al. |
| 2014/0097004 A1 | 4/2014 | Yoshioka et al. |
| 2014/0182887 A1 | 7/2014 | Yoshioka et al. |
| 2014/0183751 A1 | 7/2014 | Yoshioka et al. |
| 2015/0027528 A1 | 1/2015 | Turner et al. |
| 2015/0034366 A1 | 2/2015 | Yoshioka et al. |
| 2015/0156873 A1 | 6/2015 | Yoshioka et al. |
| 2015/0194573 A1 | 7/2015 | Lee et al. |
| 2015/0207039 A1 | 7/2015 | Lee et al. |
| 2015/0343664 A1 | 12/2015 | Liu |
| 2015/0357487 A1 | 12/2015 | Schultz-Wittmann et al. |
| 2016/0197243 A1 | 7/2016 | Lee et al. |
| 2016/0315072 A1 | 10/2016 | Keser et al. |
| 2017/0148845 A1 | 5/2017 | Lee et al. |
| 2017/0236952 A1 | 8/2017 | Schultz-Wittmann et al. |
| 2018/0240746 A1* | 8/2018 | Tsujita .................. H10F 39/804 |
| 2020/0043872 A1* | 2/2020 | Yamashiro .......... H01L 21/4882 |

FOREIGN PATENT DOCUMENTS

| | | |
|---|---|---|
| JP | 2003-163312 | 6/2003 |
| JP | 2008-016362 | 1/2008 |
| JP | 2009-081194 | 4/2009 |
| JP | 2009-081196 | 4/2009 |
| JP | 2011-100778 | 5/2011 |
| JP | 2011-109094 | 6/2011 |
| JP | 2015-510692 | 4/2015 |
| JP | 2016-157816 | 9/2016 |
| JP | 2016-219530 | 12/2016 |
| JP | 2016219530 A * | 12/2016 |
| JP | 2017-152504 | 8/2017 |
| JP | 2018-041897 | 3/2018 |

* cited by examiner

METHOD OF MANUFACTURING BASE MEMBER, METHOD OF MANUFACTURING LIGHT-EMITTING DEVICE, BASE MEMBER, AND LIGHT-EMITTING DEVICE

CROSS-REFERENCE TO RELATED APPLICATIONS

The present application is a national phase application of PCT Application No. PCT/JP2021/023048, filed on Jun. 17, 2021, and claims priority to JP Application No. 2021-082118, filed on May 14, 2021, and claims priority to JP Application No. 2020-111819, filed on Jun. 29, 2020, the entire contents of which are herein incorporated by reference.

TECHNICAL FIELD

The present disclosure relates to a method of manufacturing a base member, a method of manufacturing a light-emitting device, a base member, and a light-emitting device.

BACKGROUND ART

Patent document 1 describes, for example, a light-emitting device including an LED chip on a mounting substrate where a wiring layer (wiring electrode) is formed. In Patent Document 1, the mounting substrate is mentioned as being made of, for example, ceramic. In the light-emitting device configured in this way, the wiring electrodes, etc., other than connection portions are normally protected by an insulating film in order to protect the wiring electrodes and electrodes of the LED chip. In the light-emitting device mentioned in Patent Document 1, the wiring electrodes, etc., other than the connection portions are protected by an ALD film that is formed integrally with a surface of the LED chip or the like by using an Atomic Layer Deposition (ALD) method. Furthermore, Patent Document 1 describes that the insulating film is removed by polishing.

Patent Document 1: JP 2017-152504 A

SUMMARY OF THE INVENTION

It is not always easy to selectively remove a portion of the insulating film at a desired position by polishing the insulating film.

Therefore, the present disclosure advantageously allows for a method of manufacturing a base member, a method of manufacturing a light-emitting device, a base member, and a light-emitting device that can easily and selectively remove an insulating film located at a desired position.

A method of manufacturing a base member in one aspect according to the present disclosure includes: preparing a structure including a base having a first surface and a second surface opposite to the first surface, an electrode disposed on the first surface of the base, and an insulating film covering the first surface and the second surface of the base and the electrode; and exposing the electrode from the insulating film by irradiating the insulating film on the electrode with a laser light.

A method of manufacturing a base member in another aspect according to the present disclosure includes: preparing a structure including a ceramic body containing a metallic element as a constituent element so as to form a base, an electrode disposed on a first surface of the ceramic body, and an insulating film covering the first surface and the electrode; and exposing the electrode from the insulating film by irradiating the insulating film from above with a laser beam to remove a part of the electrode such that the ceramic body immediately under the electrode is not exposed from the electrode, the laser beam passing through the insulating film and being absorbed in the electrode.

A base member in one aspect according to the present disclosure includes: a base having a first surface and a second surface opposite to the first surface; an electrode disposed on the first surface of the base and including a pad portion and a drawn portion electrically connected to the pad portion; and an insulating film covering the drawn portion, wherein at least a part of the pad portion is exposed from the insulating film, and a surface roughness of the pad portion at the exposed part is greater than a surface roughness of the drawn portion.

A base member in another aspect according to the present disclosure includes: a base having a first surface and a second surface opposite to the first surface; an electrode disposed on the first surface of the base and including a pad portion and a drawn portion electrically connected to the pad portion; and an insulating film covering the drawn portion, wherein a part of the pad portion is exposed from the insulating film, and a surface roughness of the pad portion at the exposed part is greater than a surface roughness of the pad portion covered with the insulating film.

A light-emitting device in one aspect according to the present disclosure includes the base member and a light-emitting element provided in a mounting region.

A light-emitting device in another aspect according to the present disclosure includes a base member provided with the frame and a light-emitting element provided in a mounting region, further including a sealing member that seals a region enclosed by the frame.

The present disclosure configured as mentioned above allows for a method of manufacturing a base member, a method of manufacturing a light-emitting device, a base member, and a light-emitting device that can easily and selectively remove an insulating film located at a desired position.

DETAILED DESCRIPTION OF EMBODIMENTS OF THE INVENTION

Figure 1A:
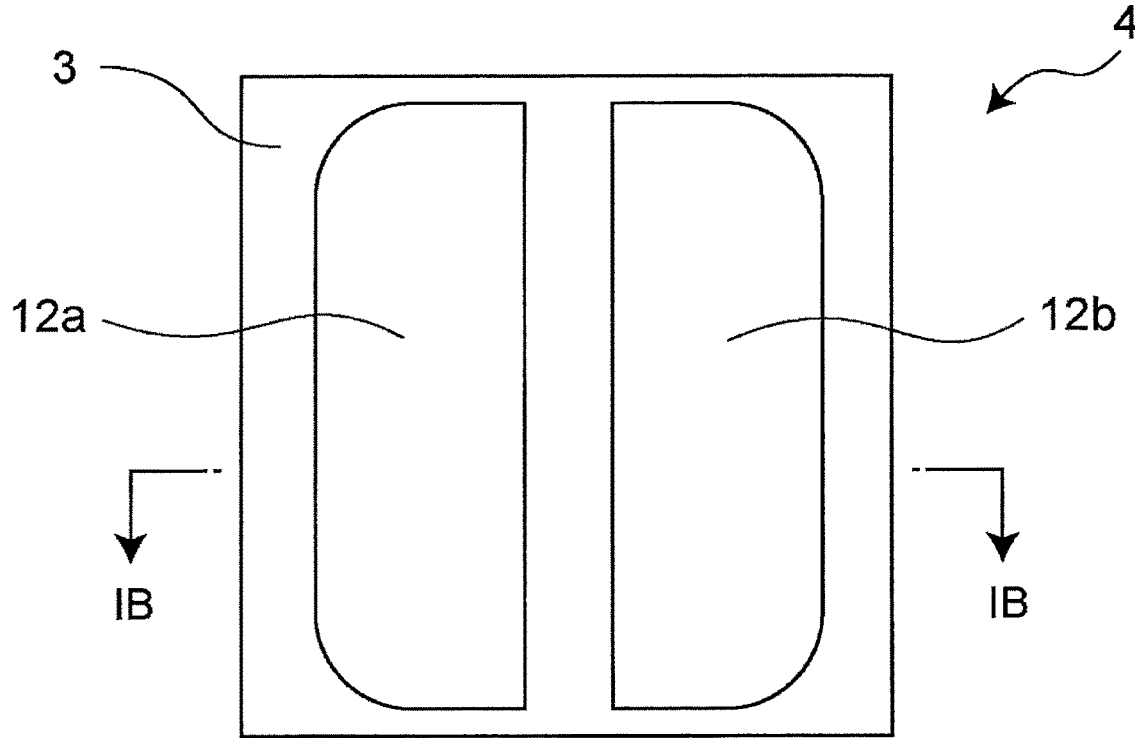
FIG. 1A is a bottom view of a ceramic structure according to a first embodiment.

Since the drawings referred to in the description regarding embodiments below schematically illustrate the present disclosure, the scales, the intervals, the positional relationships, and the like of respective members may be exaggerated, or illustration of part of the members may be omitted. The scales or intervals of the respective members may not be identical to each other. In the following description, the same names and reference characters designate the same or similar members in principle, and detailed explanations thereof will be omitted as appropriate. In the configuration of a wiring board, the terms "top", "bottom", "left", "right", etc., are interchangeable depending on the situation. In this specification, the terms "above," "below," etc., indicate relative positions between components in the drawings referenced for explanation, and are not intended to indicate absolute positions unless otherwise specified.

Hereinafter, embodiments according to the present disclosure will be described.

First Embodiment

A method of manufacturing a base member (ceramic member) of a first embodiment is made based on the following inventor's original findings.

Specifically, the inventors have attempted to irradiate an insulating film with a laser beam to remove a portion of the insulating film located in the position where the laser beam is applied in order to easily and selectively remove the insulating film at the desired position (hereinafter also referred to as laser ablation).

However, when intended to remove an insulating film formed on a ceramic body containing a metallic element as a constituent element by laser ablation, it is found that the ceramic body can be conductorized due to the laser irradiation. The reason why the ceramic body is conductorized is thought to be that the ceramic body is irradiated with the laser beam having passed through the insulating film.

Meanwhile, an insulating film of the same material formed on an electrode is removed by laser ablation.

As a result of further study, the inventors have obtained the findings that if the insulating film formed on the electrode allows a laser beam to pass therethrough, but the electrode is disposed ahead of where the laser beam has passed through the insulating film and absorbs the light beam, for example, a part of the electrode near its surface is scraped by irradiation with the laser beam, and thereby the insulating film is removed along with the scraped part of the electrode.

Hereinafter, the "electrode" includes a metallic material and has conductivity, but for convenience in explaining the structure, it may also be expressed as an element electrode, an external connection electrode, an element connection electrode, etc.

The method of manufacturing a ceramic member (base member) according to the first embodiment is made based on the above findings independently obtained by the inventors. The manufacturing method includes: a preparation step of preparing a ceramic structure including a ceramic body containing a metallic element as a constituent element, an electrode disposed on a first surface of the ceramic body, and an insulating film covering the first surface and the electrode; and an electrode exposure step of exposing the electrode from a surface of the insulating film by irradiating the insulating film from above with a laser beam, which has passed through the insulating film to be absorbed in the electrode, thereby removing a part of the electrode such that the ceramic body immediately under the electrode is not exposed from the electrode.

The method of manufacturing a ceramic member according to the first embodiment will be described using FIGS. 1A to 1C.

In the preparation step, a ceramic body 3 is, for example, as follows.

The ceramic body 3 contains a metallic element as the constituent element. An example of the metallic element is aluminum. The material for the ceramic body containing aluminum is, for example, aluminum nitride or aluminum oxide. As illustrated in FIG. 1A and FIG. 1B, in the preparation step, a ceramic structure 4 is prepared, in which the ceramic structure 4 includes the ceramic body, electrodes (external connection electrodes 12a and 12b) provided on the first surface of the ceramic body, and an insulating film 30 covering the first surface of the ceramic body and the electrodes. At least the surface of this electrode preferably contains gold, thereby allowing the insulating film 30 on the electrode to be easily removed by laser ablation in the electrode exposure step. The insulating film 30 contains, for example, at least one selected from the group consisting of silicon oxide, aluminum oxide, niobium oxide, tantalum oxide, aluminum nitride, silicon nitride, and silicon oxynitride. The insulating film 30 is formed, for example, by the atomic layer deposition method.

The insulating film 30 may be a single-layer film or a multilayer film, but a multilayer film is preferred. By forming the insulating film 30 composed of a multilayer film, the gas barrier property of the insulating film 30 is improved. The insulating film 30 can also be used as an optical functional film such as an antireflection film.

Figure 1B:
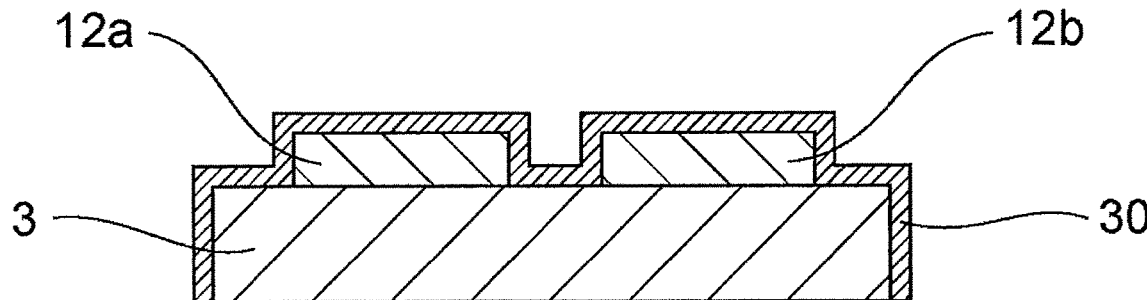
FIG. 1B is a cross-sectional view of the ceramic structure according to the first embodiment, taken along the line IB-IB in FIG. 1A.
Figure 1C:
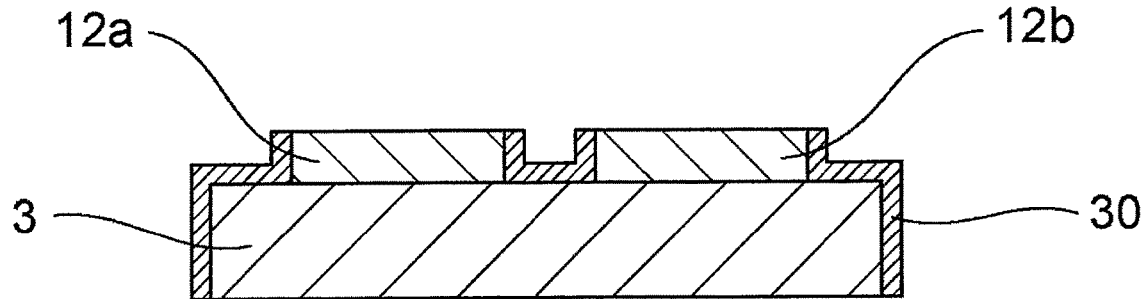
FIG. 1C is a cross-sectional view of a ceramic member according to the first embodiment.

FIG. 1B is a cross-sectional view taken along the line IB-IB in FIG. 1A. FIG. 1C is a cross-sectional view of the ceramic member of the first embodiment according to the present disclosure. That is, this figure illustrates a schematic diagram of the state in which parts of the electrodes of the ceramic structure 4 are removed by laser ablation with the electrodes being exposed from the insulating film 30.

The peak wavelength of the laser beam used for irradiation in the electrode exposure step is set such that it passes through the insulating film 30 and is absorbed in the electrodes provided under the insulating film 30. The peak wavelength can be set, for example, in the range from 250 nm to 550 nm, inclusive. Here, in terms of equipment cost of a laser device (equipment) used for laser ablation, visible light tends to be cheaper than ultraviolet light, and in the visible light, green light also tends to be cheaper than blue light. Therefore, it is preferable to use a laser beam with a longer wavelength as long as the laser ablation can be performed within the above peak wavelength range.

Specifically, the peak wavelength of the laser beam used is preferably in the range from 260 nm to 540 nm and more preferably 400 nm to 535 nm, inclusive. The peak wavelength of the laser beam is particularly preferably 500 nm or higher and 535 nm or lower.

A laser irradiation device that emits a laser beam with the peak wavelength in the above range is less expensive than a laser irradiation device using UV light and thus can reduce manufacturing equipment costs. Further, this laser irradiation device is inexpensive and thus can also reduce manufacturing equipment costs, compared to devices for patterning using a photoresist and wet cleaning, which are examples of other methods of forming the insulating film 30.

The peak wavelength of the laser beam is set by adjusting it within the above range in consideration of the materials of the insulating film and the electrode.

The intensity of the laser beam for irradiation in the electrode exposure step is set such that a portion of the electrode, for example, a portion of the electrode near the interface between the insulating film 30 and the electrode, is removed such that the ceramic body 3 immediately under the electrode is not exposed from the electrode. The intensity of the laser beam is set such that the thickness of the electrode material to be removed on the electrode surface is, for example, in the range from 0.5 nm to 500 nm, inclusive. When setting the intensity of the laser beam for irradiation, it is preferable to set it such that the thickness of the electrode material to be removed on the electrode surface is 200 nm or less.

The irradiation spot diameter of the laser beam for irradiation is, for example, in the range from 15 μm to 60 μm, and preferably 15 to 30 μm, inclusive.

Setting the irradiation spot diameter in such a range can suppress the deterioration of the flatness of the electrode surface due to laser ablation. The energy distribution of the laser beam is not always uniform with respect to the irradiation spot. Thus, when the irradiation spot diameter of the laser beam is large, the non-uniformity of the energy distribution within the irradiation spot diameter is reflected to the surface roughness of the electrode, resulting in the deterioration of the flatness of the electrode surface. If the energy distribution of the laser beam within the irradiation spot diameter is constant regardless of the irradiation spot diameter size, the smaller the irradiation spot diameter, the smaller variations in the processing depth within the irradiation spot diameter become. Therefore, by setting the spot diameter in the above range, the deterioration of the flatness of the electrode surface due to laser ablation can be suppressed. In addition, the insulating film on the electrode surface can be efficiently removed by irradiating the insulating film with the laser beam while causing irradiation spots of the laser beam to partly overlap each other. The overlap range is, for example, $\frac{2}{3}$ or less, $\frac{1}{2}$ or less, $\frac{1}{3}$ or less, $\frac{1}{4}$ or less, or $\frac{1}{5}$ or less of the laser spot area.

The laser beam for irradiation in the electrode exposure step is preferably one emitted from a pulsed laser. The pulse energy of the laser beam is set, for example, in the range of 1 μJ to 1,000 J, preferably 2 μJ to 300 μJ, more preferably 3 μJ to 100 μJ, and still more preferably 3 μJ to 10 μJ, inclusive. The pulse width of the laser beam is set, for example, in the range from 100 femtoseconds to 2,000 femtoseconds, preferably 100 femtoseconds to 1,000 femtoseconds, and more preferably from 100 femtoseconds to 500 femtoseconds, inclusive.

By using such a pulsed laser, the conductorization of the ceramic body can be suppressed while removing the insulating film on the electrode.

When a pulsed laser is used in the electrode exposure step, it is preferable to scan the insulating film by the laser such that irradiation regions with the laser beam partly overlap each other. The use of the pulsed laser reduces the thermal effects by the laser beam and allows the insulating film to be removed while maintaining an electrode structure.

Since the removal of the insulating film by laser ablation mentioned above is a dry method, it does not require a drying step. In addition, when comparing between before the formation of the insulating film and after the execution of the laser ablation, a change in resistance is relatively small, and the wettability of solder on the electrode is favorable.

It is noted that the pulse energy and pulse width of the laser beam for irradiation in the electrode exposure step are set in consideration of the material of the insulating film, the material of the electrode, the thickness of the insulating film, the thickness of the electrode, the laser beam spot diameter, and the like.

For example, when the insulating film is made of aluminum oxide (for example, $Al_2O_3$) with a thickness of 400 nm, while the electrode is made of Au plating with a thickness of 1 μm, the pulse energy and pulse width of the laser beam for irradiation are set, for example, in the range from 1 μJ to 1,000 μJ and from 100 femtoseconds to 2,000 femtoseconds, preferably from 3 μJ to 100 μJ and from 100 femtoseconds to 1,000 femtoseconds, and more preferably from 3 μJ to 10 μJ and from 100 femtoseconds to 500 femtoseconds, inclusive, respectively.

Hereinafter, a description will be given on a method of manufacturing a light-emitting device, including the above-mentioned method of manufacturing a ceramic member, and on a light-emitting device fabricated by the manufacturing method.

Second Embodiment

Figure 2A:
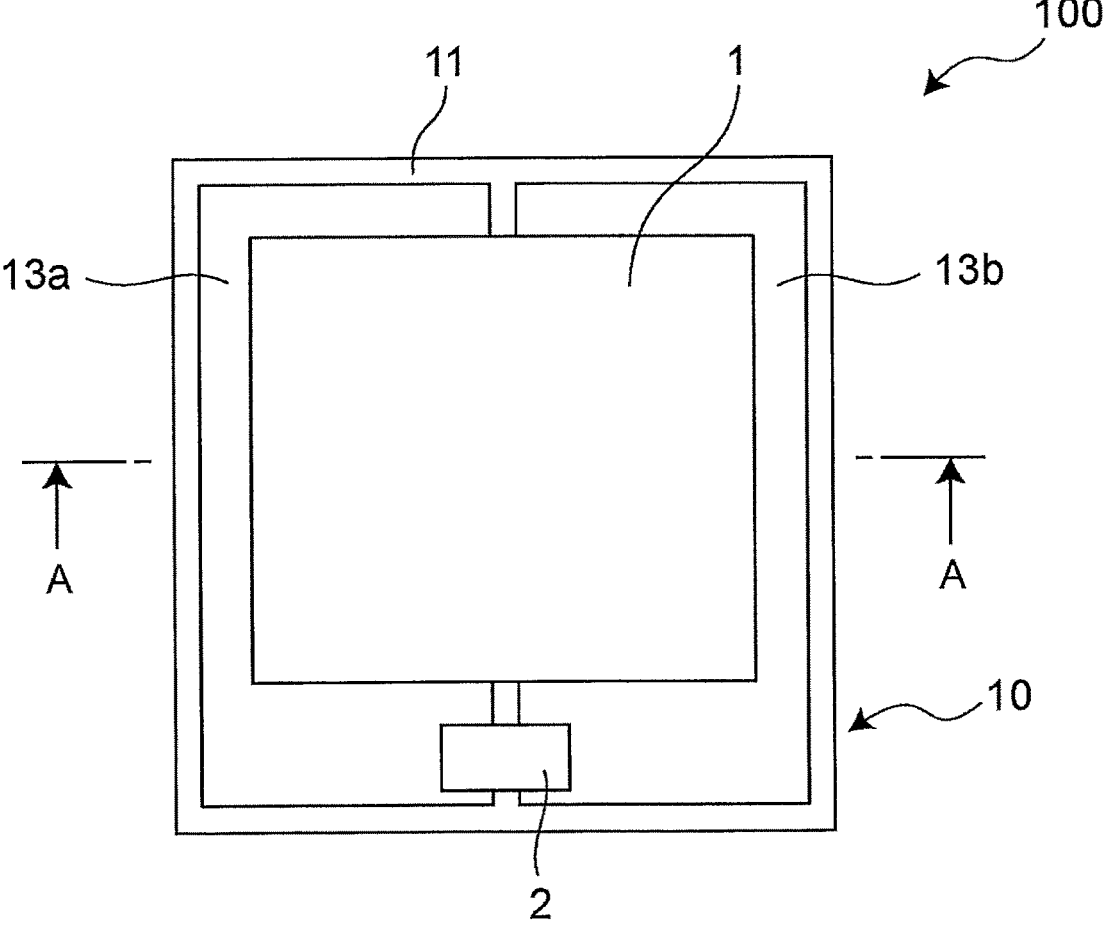
FIG. 2A is a top view of a light-emitting device according to a second embodiment.
Figure 2B:
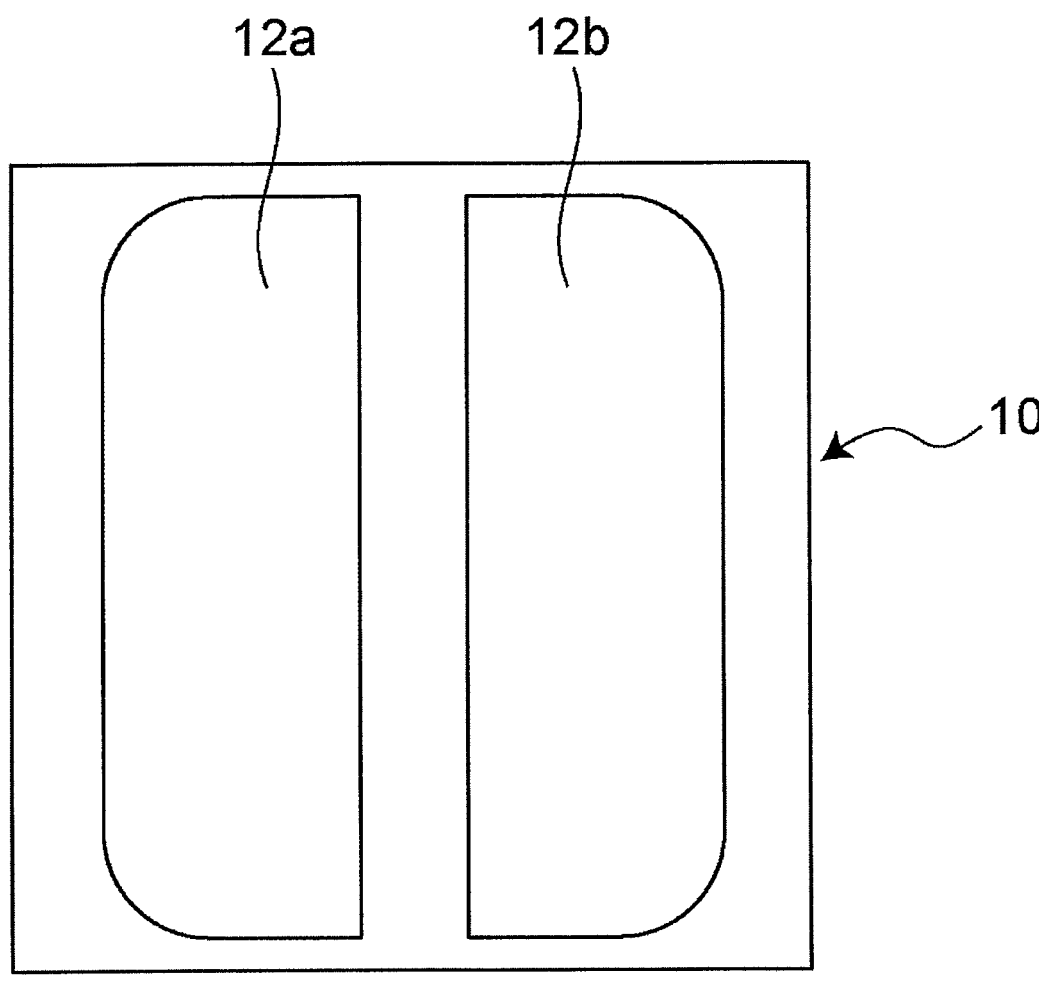
FIG. 2B is a bottom view of the light-emitting device according to the second embodiment.
Figure 2C:
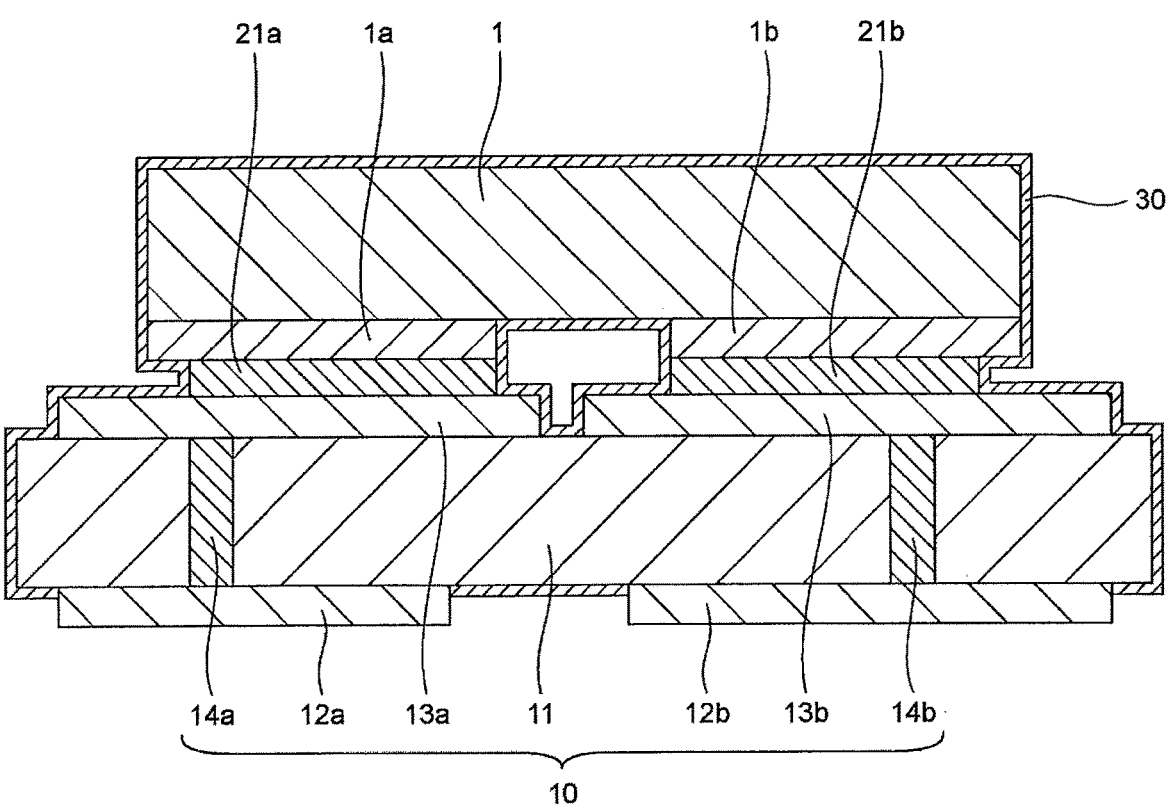
FIG. 2C is a cross-sectional view of the light-emitting device according to the second embodiment, taken along the line A-A in FIG. 2A.

A light-emitting device 100 of a second embodiment includes a mounting substrate 10 and a light-emitting element 1 mounted on the mounting substrate 10 as illustrated in FIGS. 2A to 2C.

The mounting substrate 10 includes a substrate 11, element connection electrodes 13a and 13b formed on a top surface of the substrate 11, and the external connection electrodes 12a and 12b formed on a lower surface of the substrate 11 as illustrated in FIG. 2C. The element connection electrodes 13a and 13b and the external connection electrodes 12a and 12b are connected by through-electrodes 14a and 14b formed in through-holes of the substrate 11, respectively.

The light-emitting element 1 is, for example, a flip chip light-emitting element that includes two element electrodes 1a and 1b with different polarities on an electrode formation surface opposite a light-emitting surface. The element electrodes 1a and 1b are connected to the element connection electrodes 13a and 13b, respectively.

In the light-emitting device 100 of the second embodiment, all outer surfaces including the surface of the light-emitting element 1, other than the surfaces of the external connection electrodes 12a and 12b connected to external wirings, are covered with the insulating film 30 which is formed, for example, by the atomic layer deposition method mentioned below.

According to the light-emitting device 100 of the second embodiment configured as mentioned above, a highly reliable light-emitting device with excellent moisture resistance, etc., can be provided without having, for example, a sealing member covering the light-emitting element.

Method of Manufacturing Light Emitting Device of Second Embodiment

The method of manufacturing a light-emitting device of the second embodiment includes a step of mounting the light-emitting element in the preparation step of the method of manufacturing a ceramic member of the first embodiment.

Specifically, the external connection electrodes are formed on the lower surface of the substrate, which is the ceramic body containing metal. After forming the element connection electrodes on the top surface of which the element electrodes of the light-emitting element are to be connected, the light-emitting element is mounted. Then, the insulating film is formed on all surfaces including the surface of the light-emitting element and the surface of the substrate, whereby a light-emitting device structure including the ceramic member is prepared.

That is, in the method of manufacturing a light-emitting device of the second embodiment, the preparation step includes: 1-1. mounting substrate preparation step; 1-2. light-emitting element mounting step; and 1-3. insulating film formation step.

The method of manufacturing a light-emitting device of the second embodiment will be described in more detail below.

In the description below, the substrate including the external connection electrodes and the element connection electrodes is referred to as a mounting substrate (ceramic member), and a portion of the substrate excluding the external connection electrodes and the element connection electrodes is simply referred to as a substrate (ceramic body).

1-1. Mounting Substrate Preparation Step

Figure 3A:
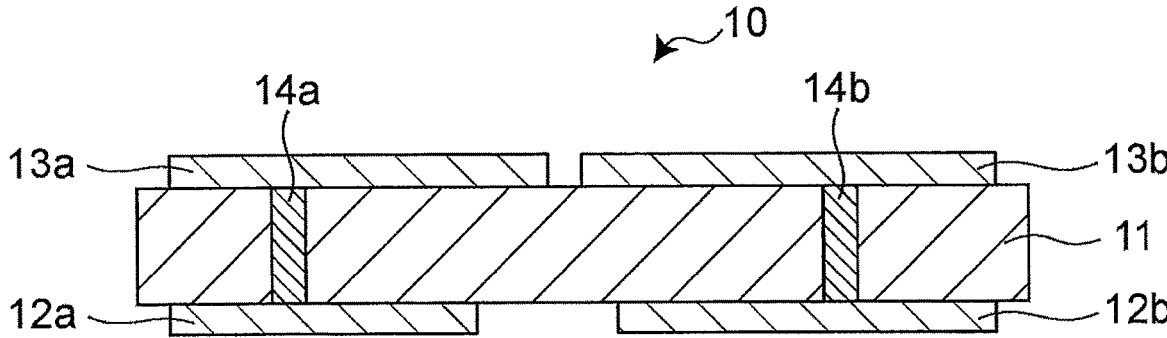
FIG. 3A is a cross-sectional view of a mounting substrate prepared in a mounting substrate preparation step of the manufacturing method according to the second embodiment.

Here, first, the mounting substrate illustrated in FIG. 3A is prepared. Specifically, the mounting substrate 10 is prepared which includes: the external connection electrode 12a and the external connection electrode 12b on the lower surface (first surface) of the substrate 11: the element connection electrode 13a and the element connection electrode 13b on the top surface thereof (second surface), to which the element electrodes 1a and 1b of the light-emitting element 1 are to be connected, respectively; and the through-electrode 14a and the through-hole 14b electrically connecting between the external connection electrode 12a and the element connection electrode 13a and between the external connection electrode 12b and the element connection electrode 13b, respectively.

1-2. Light-Emitting Element Mounting Step

Here, the light-emitting element 1 is mounted.

Figure 3B:
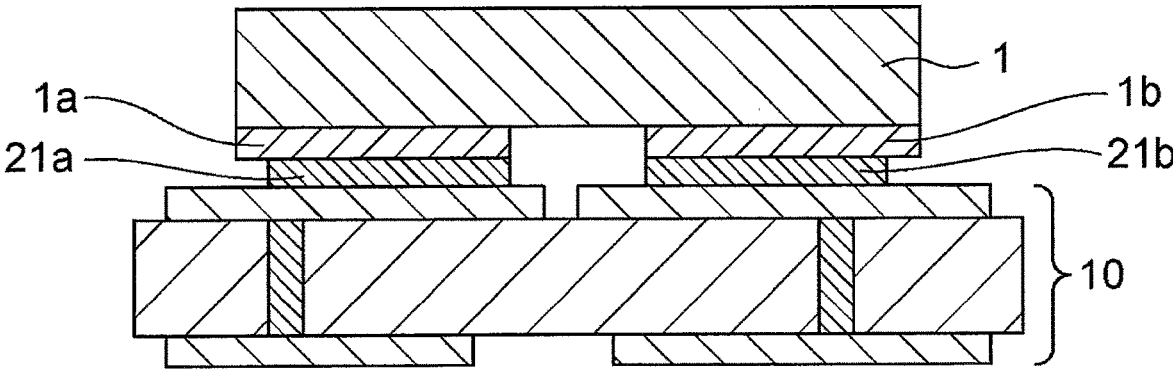
FIG. 3B is a cross-sectional view when a light-emitting element 1 is mounted on the mounting substrate in a mounting step of the manufacturing method according to the second embodiment.

Specifically, as illustrated in FIG. 3B, the element connection electrodes 13a and 13b of the mounting substrate 10 are connected to the element electrodes 1a and 1b of the light-emitting element 1 via connection members 21a and 21b, respectively.

Here, although the light-emitting element 1 illustrated in FIG. 3B is depicted in a simple manner that it includes the element electrodes 1a and 1b on the same plane side, the element electrode 1a is, for example, a p-side element electrode connected to a p-side semiconductor layer, while the element electrode 1b is, for example, an n-side element electrode connected to an n-side semiconductor layer.

Although not illustrated in FIG. 3B, a protective element may be mounted in addition to the light-emitting element 1.

1-3. Insulating Film Formation Step

Figure 3C:
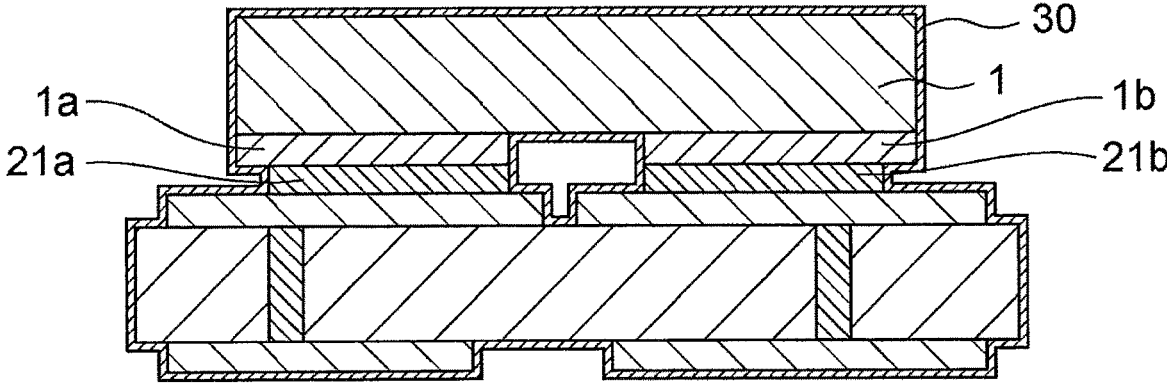
FIG. 3C is a cross-sectional view when an insulating film 30 is formed in an insulating film formation step of the manufacturing method according to the second embodiment.

Here, the insulating film 30 is formed on all surfaces including the surfaces of the mounted light-emitting element and the surfaces of the mounting substrate. All surfaces as used herein refer to all respective surfaces of the mounting structure exposed to the outside, including the surfaces of the light-emitting element, the surfaces of the substrate 11, the surfaces of the element connection electrodes 13a and 13b, the surfaces of the connection members 21a and 21b, the surfaces of the element electrodes 1a and 1b of the light-emitting element 1, and the surfaces of the external connection electrodes 12a and 12b, as illustrated in FIG. 3C.

The insulating film 30 is preferably formed by the atomic layer deposition method. The atomic layer deposition method can form dense insulating films 30 with uniform thickness on all surfaces, including surfaces in different plane directions. The insulating film 30 even with a relatively thin thickness can secure the protective function, and as a result, a portion of the insulating film 30 to be removed by laser ablation can be thinned, which enables easy removal of the insulating film 30 by the laser ablation.

The atomic layer deposition method is a method in which atomic layers of reactive components are formed one by one with each atomic layer at a time. For example, the following procedure is performed in order to form a protective film of aluminum oxide ($Al_2O_3$) using TMA (trimethylaluminum) and water ($H_2O$).

First, $H_2O$ gas is introduced to form OH groups on the surface where the insulating film is to be formed (first reaction). Then, excess gas is exhausted, and then TMA gas is introduced to cause the OH groups formed in the first reaction to react with TMA (second reaction). Then, excess gas is exhausted. Subsequently, the first reaction, the exhaust, the second reaction, and the exhaust are defined as one cycle, and this cycle is repeated so that an $Al_2O_3$ film with a predetermined film thickness can be formed.

The atomic layer deposition method is a deposition method with low directivity of reactive components and excellent step coverage. Unlike sputtering, CVD, etc., in the atomic layer deposition method, reactive components are supplied even in the vicinity of obstacles. As a result, a better protective film with more uniform thickness and film quality can be formed also in a region between the light-emitting element and the substrate in the same manner as other regions without obstacles.

Compared to insulating films obtained by sputtering, CVD, etc., an insulating film obtained by the atomic layer deposition method has an excellent protective function and favorable film quality with fewer pinholes.

The insulating film 30 can adopt, for example, silicon oxide ($SiO_2$), aluminum nitride (AlN) or silicon nitride ($Si_3N_4$), niobium oxide $Nb_2O_5$), (tantalum oxide ($Ta_2O_3$), or silicon oxynitride ($SiO_xN_y$), in addition to aluminum oxide ($Al_2O_3$). The protective film preferably uses aluminum oxide or silicon oxide. More preferably, it is a multilayer structure of two or more layers made of aluminum oxide and silicon oxide. By forming the multilayer film as the protective film, its gas barrier property is improved. Further, the formation of the multilayer film can also impart the optical functions (e.g., the function as an antireflection film) The film thickness of the insulating film 30 is not particularly limited, but preferably 5 nm or more and 500 nm or less, more preferably 10 nm or more and 100 nm or less, and particular preferably 20 nm or more and 50 nm or less. This can achieve improvement in the productivity while suppressing permeation of moisture and humidity.

(2) Electrode Exposure Step of Second Embodiment

Figure 3D:
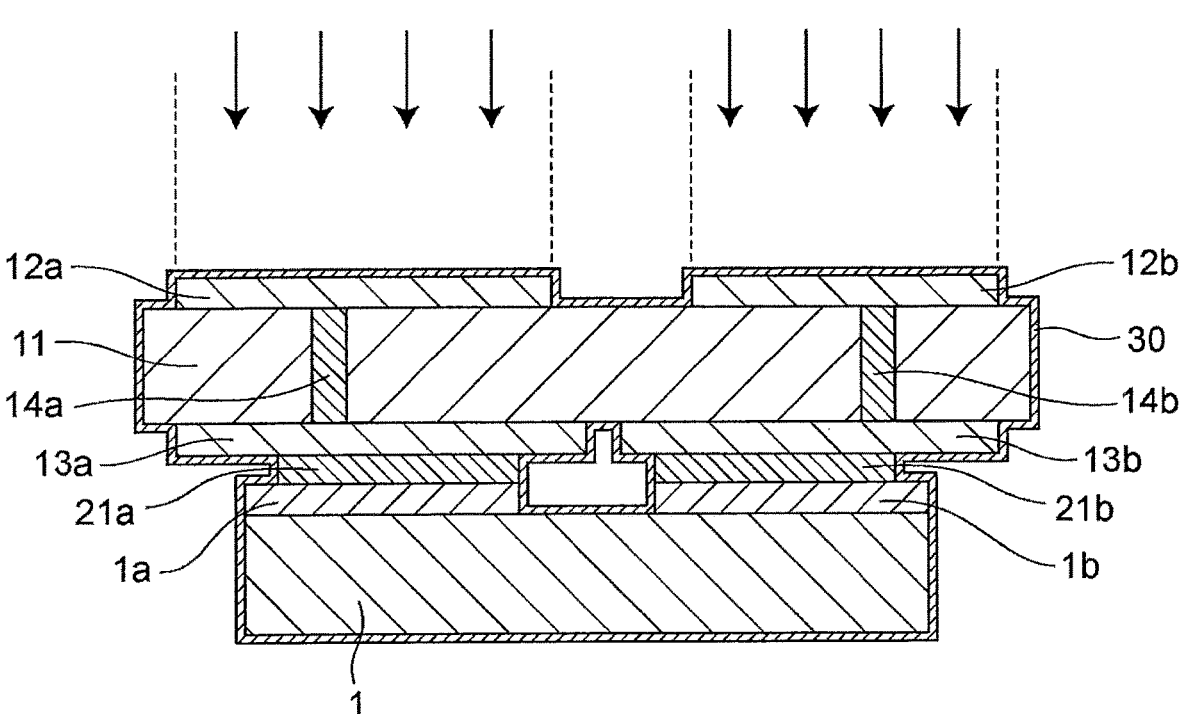
FIG. 3D is a cross-sectional view illustrating a state of irradiation with a laser beam in an electrode exposure step of the manufacturing method according to the second embodiment.

As illustrated in FIG. 3D, in the electrode exposure step of the second embodiment, the laser beam is applied from above the insulating film 30, passes through the insulating film 30, and is absorbed in the external connection electrodes 12a and 12b provided under the insulating film 30. Consequently, a part of the surface of each of the external connection electrodes 12a and 12b, for example, electrode material in the vicinity of the interface between the insulating film 30 and the external connection electrodes 12a and 12b is removed such that the ceramic body (substrate 11) is not exposed from the external connection electrodes 12a and 12b. By the removal of the electrode material, the external connection electrodes 12a and 12b are exposed from the insulating film 30. At this time, the pulse energy of the pulsed laser beam is set, for example, in the range from 1 μJ to 1,000 J, preferably 2 μJ to 300 μJ, more preferably 3 ρJ to 100 ρJ, and still more preferably 3 μJ to 10 μJ, inclusive. The pulse width of the laser beam is set, for example, in the range from 100 femtoseconds to 2,000 femtoseconds, preferably 100 femtoseconds to 1,000 femtoseconds, and more preferably 100 femtoseconds to 500 femtoseconds, inclusive. By using such a pulsed laser, the conductorization of the ceramic body can be suppressed while removing insulating film on the electrode.

Through the above steps, the light-emitting device 100 illustrated in FIG. 2C is manufactured by the method of manufacturing a light-emitting device of the second embodiment.

In the electrode exposure step, the laser beam preferably scan at least once the entire surface of the mounting substrate 10 on the side of the external connection electrodes 12a and 12b in the plan view. When the electrode material is provided immediately below the insulating film 30, the insulating film 30 is removed together with the electrode material. Meanwhile, the insulating film 30 directly provided on the ceramic body remains on the ceramic body, so that the ceramic body is not exposed from the insulating film 30. Therefore, by causing the laser beam to scan at least once the entire surface of the mounting substrate 10 on the side where the external connection electrodes 12a and 12b are provided, the external connection electrodes 12a and 12b can be exposed selectively from the insulating film 30 without alignment of the laser. More preferably, in each row where the scanning is applied by the laser beam, it is desirable that at least parts of the irradiation spots of the laser beam in adjacent rows overlap each other. This enables more reliable scanning of the entire surface of the mounting substrate 10 on the side where the external connection electrodes 12a and 12b are provided.

FIG. 2A is a top view of the light-emitting device 100, while FIG. 2B is a bottom view of the light-emitting device 100. As illustrated in FIG. 2A, for example, the light-emitting device 100 includes a protective element 2.

Third Embodiment

A light-emitting device and a method of manufacturing a light-emitting device of a third embodiment will be described below.

The light-emitting device of the third embodiment differs mainly in the following points.

(a) The light-emitting device of the third embodiment has a package 110 as the ceramic member instead of the mounting substrate 10.

(b) The light-emitting device of the third embodiment has a distributed Bragg reflector film 230 made of a dielectric multilayer film as the insulating film.

The method of manufacturing a light-emitting device of the third embodiment differs in the following points, as well as the above-mentioned differences regarding the light-emitting device.

(c) The mounting step of the light-emitting element, which is included in the preparation step of the method of manufacturing a light-emitting device of the second embodiment, is included to be performed after the electrode exposure step.

Hereinafter, a light-emitting device and a method of manufacturing a light-emitting device of the third embodiment will be described in detail.

Light Emitting Device of Third Embodiment

Figure 4A:
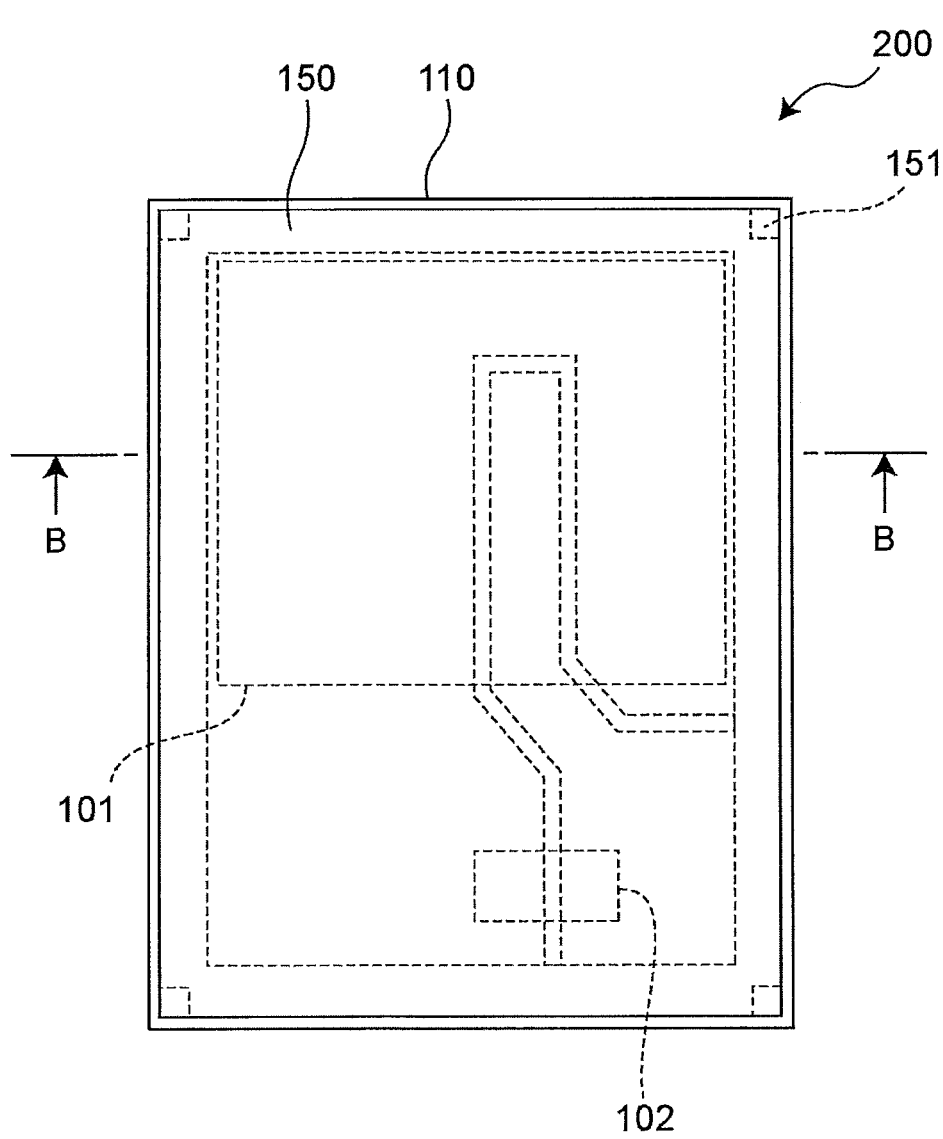
FIG. 4A is a top view of a light-emitting device according to a third embodiment.
Figure 4B:
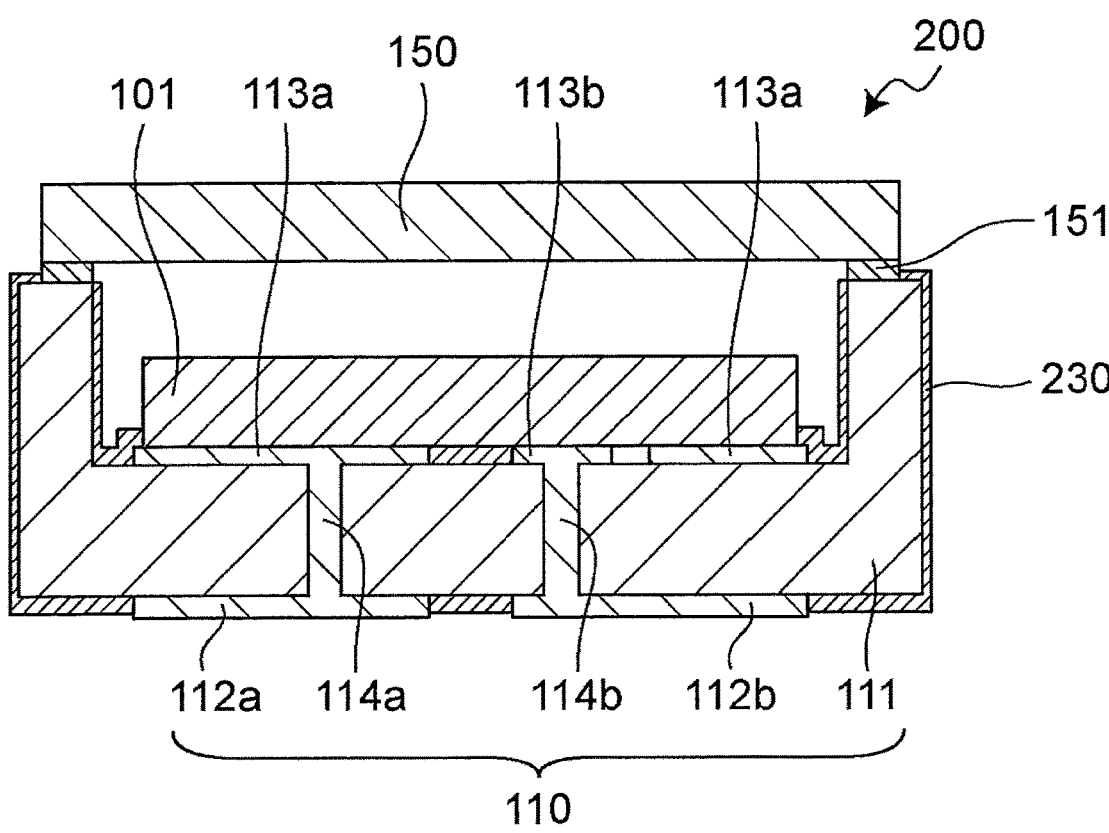
FIG. 4B is a cross-sectional view of the light-emitting device according to the third embodiment, taken along the line B-B in FIG. 4A.
Figure 4C:
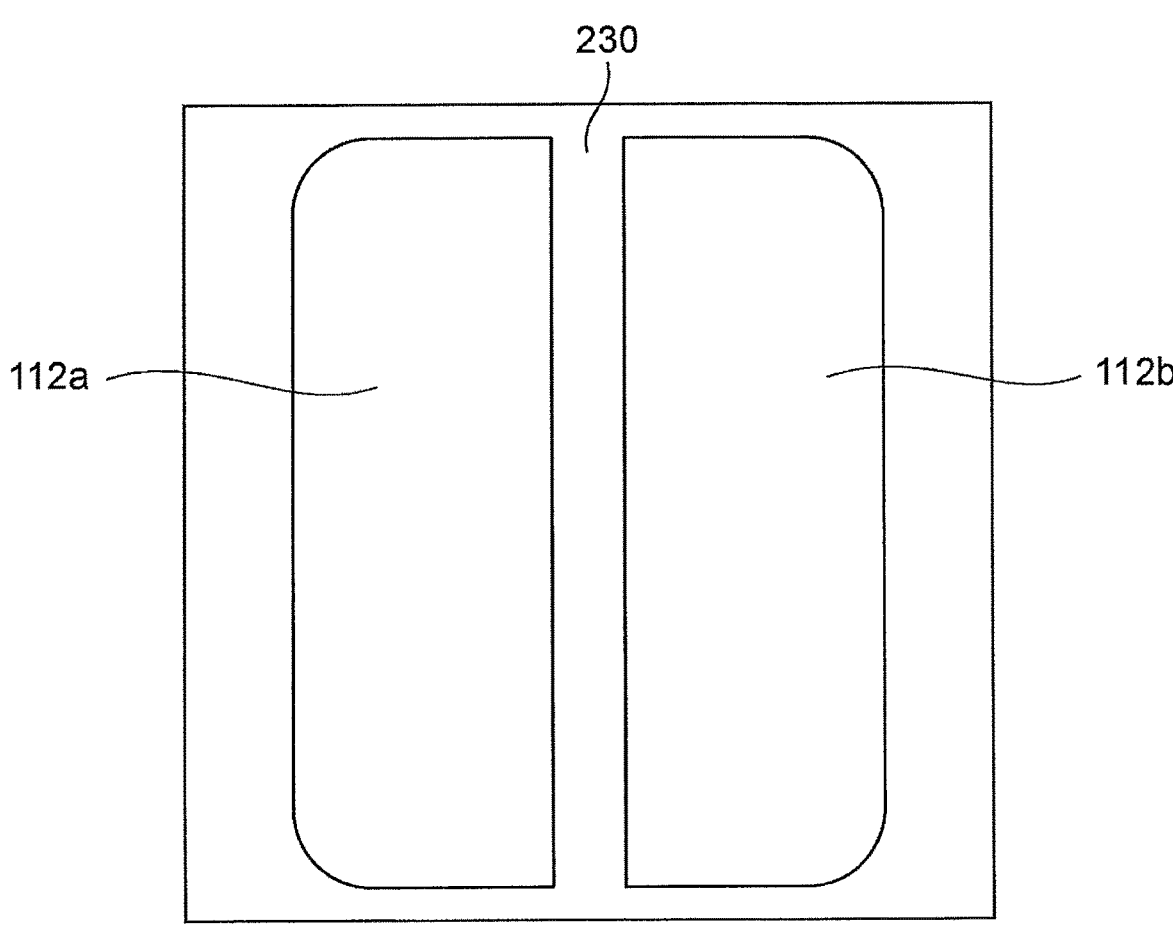
FIG. 4C is a bottom view of the light-emitting device according to the third embodiment.

In the light-emitting device of the third embodiment, the package 110 (ceramic member) includes: a ceramic base 111 (ceramic body) with a concave portion as illustrated in FIGS. 4A and 4B; element connection electrodes 113a and 113b formed at the bottom surface (second surface) of the concave portion and to which element electrodes of the light-emitting element 101 are connected; and external connection electrodes 112a and 112b formed on the lower surface (first surface) of the package 110 on the side opposite to the bottom surface of the concave portion as illustrated in FIGS. 4B and 4C.

Here, the external connection electrodes 112a and 112b and the element connection electrodes 113a and 113b are connected by, for example, through-electrodes 114a and 114b formed in through holes that penetrate the ceramic base 111, respectively.

A distributed Bragg reflector film 230 is formed on the entire surfaces of the package 110, including: a portion of the inner surface of the concave portion of the package 110 excluding portions where the element connection electrodes 113a and 113b are formed; a portion of the package 110 excluding portions where the external connection electrodes 112a and 112b are formed; the side surfaces of the package 110; and a top end surface of the package excluding a portion where a spacer 151 is formed. The distributed Bragg reflector film 230 is composed of, for example, two or more light-transmissive dielectric films with different refractive indices that are alternately stacked in a predetermined thickness, and it reflects the light emitted from the light-emitting element 101. In the light-emitting device of the third embodiment, the distributed Bragg reflector film 230 formed on the inner surface of the concave portion of the package 110 mainly serves to reflect the light emitted from the light-emitting element 101, while the distributed Bragg reflector film 230 formed on the lower surface of the package 110 serves to isolate and separate the external connection electrode 112a from the external connection electrode 112b.

The light-emitting element 101 is provided in the concave portion of the package 110, and the element electrodes of the light-emitting element 101 are connected to the element connection electrodes 113a and 113b via connection members. The light-emitting device of the third embodiment includes a light-transmissive lid 150 that is made of, for example, transparent glass and covers the concave portion of the package 110 in which the light-emitting element 101 is provided. The light-transmissive lid 150 is joined at the four corners of the top end surface of the package 110 to enclose the concave portion by the spacers 151 also serving as the connection members.

In the light-emitting device of the third embodiment configured as mentioned above, the portions of the inner surface of the concave portion of the package 110 excluding the portions where the element connection electrodes 113a and 113b are formed are covered with the distributed Bragg reflector film 230, thereby making it possible to efficiently extract the light, which has been emitted from the light-emitting element 101, to the outside via the light-transmissive lid 150, enhancing the light extraction efficiency.

Method of Manufacturing Light Emitting Device of Third Embodiment

The method of manufacturing a light-emitting device of the third embodiment differs in that the mounting step of the light-emitting element, which step is included in the preparation step of the method of manufacturing a light-emitting device of the second embodiment, is performed after the electrode exposure step, in addition to the above different points regarding the light-emitting device, as mentioned above.

The method of manufacturing a light-emitting device of the third embodiment will be specifically described below.

First of all, the method of manufacturing a light-emitting device of the third embodiment includes: 1-1. package preparation step and 1-2. distributed Bragg reflector film (insulating film) formation step in the preparation step of the method of manufacturing a ceramic member of the first embodiment.

In the description below, the ceramic base 111 (ceramic body) refers to one excluding the external connection electrodes 112a and 112b, the element connection electrodes 113a and 113b, the through-electrodes 114a and 114b and the distributed Bragg reflector film 230.

1-1. Package Preparation Step

Here, the package 110 having the concave portion is prepared.

Specifically, the ceramic base 111 having the concave portion is prepared, the external connection electrodes 112a and 112b are formed on the lower surface of the ceramic base 111, and the element connection electrodes 113a and 113b are formed at the bottom surface of the concave portion.

The ceramic base 111 can be manufactured by either the so-called post-fire or co-fire method. When manufacturing the ceramic base 111, the uppermost surface of the external connection electrode preferably contains Au.

1-2. Distributed Bragg Reflector Film (Insulating Film) Formation Step

Here, the distributed Bragg reflector film is formed on the inner surface of the concave portion of the package 110 (including the surfaces of the element connection electrodes 113a and 113b), the top end surface and side surfaces of the package 110, and the lower surface of the package 110 (including the surfaces of the external connection electrodes 112a and 112b).

The distributed Bragg reflector film is preferably formed by the atomic layer deposition (ALD). By forming it by the atomic layer deposition method, two or more dielectric films that constitute the distributed Bragg reflector film can be formed in a predetermined thickness on the bottom and side surfaces of the concave portion having different plane directions. This can make it easy to form the distributed Bragg reflective films with the same reflective properties on the bottom and side surfaces of the concave portion with different plane directions. The distributed Bragg reflector film preferably has a reflectance of 70% or more in the range from 350 nm to 410 nm and a reflectance of 20% or less in the range from 500 nm to 535 nm. Within this range, the distributed Bragg reflector film effectively transmits green light and effectively reflects ultraviolet light. When the light-emitting element emits ultraviolet light, the distributed Bragg reflector film on the electrode surface can be effectively removed by laser ablation, and furthermore the remaining distributed Bragg reflector film can contribute to improving the light extraction efficiency of the light-emitting element. The distributed Bragg reflector film can be formed, for example, by alternately forming a first dielectric film made of $Nb_2O_5$ and a second dielectric film made of $SiO_2$, for example. The thickness, number and the like of layers of the first and second dielectric films are set as appropriate in consideration of the emission wavelength of the light-emitting element 101.

When forming the first dielectric film of $Nb_2O_5$ by the atomic layer deposition method, for example, the following steps are performed.

(Step A1)

A vacuum chamber is evacuated to a predetermined vacuum level, and the ceramic member is heated to a deposition temperature. The deposition temperature is set preferably in the range from 150° C. to 300° C., and more preferably 200° C. to 250° C., inclusive.

(Step A2)

Then, an oxygen source gas containing oxygen is introduced into the vacuum chamber to bind oxygen to the entire ceramic member. For example, $O_3$ (ozone) gas can be used as the oxygen source gas. After oxygen is bound to a surface of the ceramic member, the remaining oxygen source gas is exhausted. However, in this step, by using $H_2O$, an OH group may be bound to the surface of the ceramic member.

(Step A3)

Next, an organometallic source gas containing niobium (Nb) is introduced into the vacuum chamber, causing oxygen bound to the surface of the ceramic member or the like to react with the organometallic source gas containing Nb, whereby Nb is bound to the oxygen bound to the surface of the ceramic member. For example, tris(diethylamido)(tert-butylimido)niobium(V) can be used as the organometallic source gas containing Nb.

(Step A4)

After Nb is bound to oxygen bound to the surface of the ceramic member, the remaining organometallic source gas containing Nb is exhausted.

(Step A5)

Next, an oxygen source gas containing oxygen is introduced to bind oxygen to Nb on the ceramic member.

By repeatedly performing the procedure from step A2 to step A5 on the surface of the ceramic member a predetermined number of times, a $Nb_2O_5$ film with a necessary thickness is formed.

When forming the second dielectric film made of $SiO_2$ by the atomic layer deposition method, for example, the following steps are performed.

(Step B1)

The vacuum chamber is evacuated to a predetermined vacuum level, and the ceramic member is heated to a deposition temperature. The deposition temperature is set preferably in the range from 150° C. to 300° C. and more preferably 200° C. to 250° C., inclusive.

(Step B2)

Then, an oxygen source gas containing oxygen is introduced into the vacuum chamber to bind oxygen to the entire ceramic member. $O_3$ (ozone) gas can be used as the oxygen source gas containing oxygen. After oxygen is bound to the surface of the ceramic member, the remaining oxygen source gas is exhausted. However, in this step, by using $H_2O$, an OH group may be bound to the surface of the ceramic member.

(Step B3)

Next, an organometallic source gas containing silicon (Si) is introduced into the vacuum chamber, causing oxygen bound to the surface of the ceramic member or the like to react with the organometallic source gas containing Si, whereby Si is bound to the oxygen bound to the surface of the ceramic member. As the Si source gas, tris(dimethylamino)silane gas, bis(diethylamino)silane gas, etc., can be used.

(Step B4)

After Si is bound to the surface of the ceramic member, the remaining organometallic source gas containing Si is exhausted.

(Step B5)

Next, an oxygen source gas containing oxygen is introduced to bind oxygen to Si on the ceramic member.

By repeatedly performing the procedure from step B2 to step B5 on the surface of the ceramic member a predetermined number of times, a $SiO_2$ film with a necessary thickness is formed.

It is noted that the formation method of the distributed Bragg reflector film is not limited to the atomic layer deposition method, but may be sputtering or vapor deposition.

In addition, the distributed Bragg reflector film may be selectively formed on the inner surface of the concave portion of the package 110 (including the surfaces of the element connection electrodes 113a and 113b) as well as the lower surface of the package 110 (including the surfaces of the external connection electrodes 112a and 112b), excluding the top end surface and side surfaces of the package 110.

(2) Electrode Exposure Step of Third Embodiment

In the electrode exposure step of the third embodiment, a laser beam is applied from above the distributed Bragg reflector film formed on the external connection electrodes 112a and 112b and from above the distributed Bragg reflector film formed on the element connection electrodes 113a and 113b; the laser beam passes through the respective distributed Bragg reflector films to be absorbed in each of the external connection electrodes 112a and 112b and the element connection electrodes 113a and 113b. Consequently, parts of the surfaces of the external connection electrodes 112a and 112b, as well as parts of the surfaces of the element connection electrodes 113a and 113b are removed such that the ceramic base 111 is not exposed. By the removal of the electrode material in this way, the external connection electrodes 112a and 112b and the element connection electrodes 113a and 113b are exposed from the distributed Bragg reflector film 230. The peak wavelength of the laser beam is 250 nm to 550 nm, and preferably, the peak wavelength is 500 nm to 535 nm. By using the laser beam having a peak wavelength in the range from 500 nm to 535 nm, Au contained in the electrode material can be removed in a relatively inexpensive equipment by laser ablation.

Through the above step, the package 110 in the light-emitting device of the third embodiment is prepared.

(3) Mounting and Light-Transmissive Lid Joining Step

The light-emitting element 101 is mounted in the package 110 prepared as mentioned above, and the light-transmissive lid 150 is joined with the spacers 151.

Through the above step, the light-emitting device of the third embodiment is fabricated.

Fourth Embodiment

A light-emitting device and a method of manufacturing a light-emitting device of a fourth embodiment will be described below.

The light-emitting device of the fourth embodiment is configured in the same manner as the light-emitting device of the third embodiment except that element connection electrodes 113a and 113b are exposed at a plurality of locations from the distributed Bragg reflector film 230.

Figure 5:
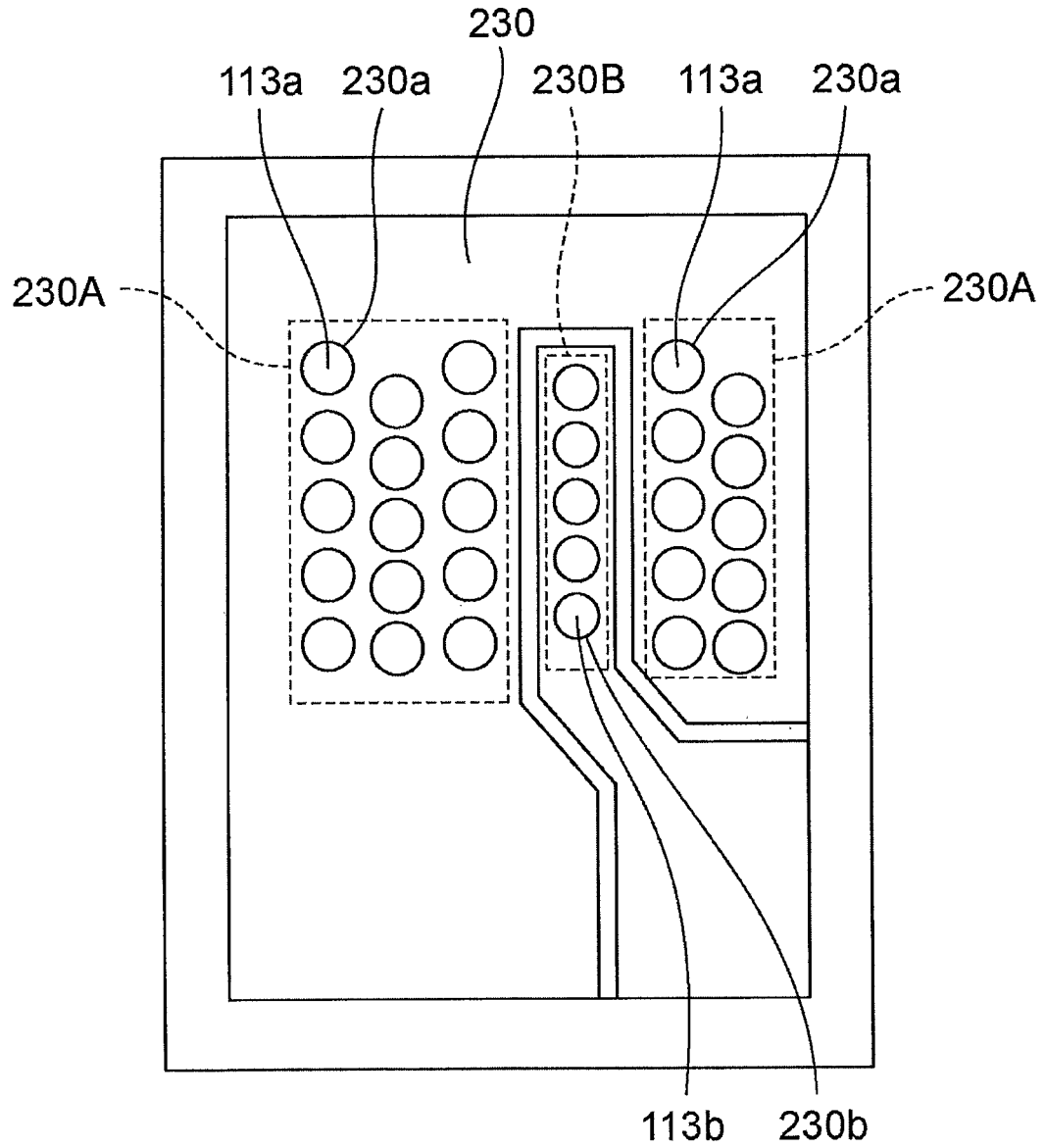
FIG. 5 is a top view of a package of a light-emitting device according to a fourth embodiment.

Specifically, portions of the element connection electrodes 113a and 113b that are connected to the element electrodes of the light-emitting element are exposed through a plurality of openings 230a and 230b provided in the distributed Bragg reflector film 230 as illustrated in FIG. 5.

It is noted that the portions where the element connection electrodes 113a and 113b are exposed in the light-emitting device of the third embodiment are, for example, rectangular openings 230A and 230B that are provided in the distributed Bragg reflector film 230, and these respective openings 230A and 230B are indicated by dotted lines in FIG. 5.

In the light-emitting device of the fourth embodiment, the openings 230a and 230b from which the element connection electrodes 113a and 113b are exposed at the plurality of locations are preferably circular and provided and distributed in all positions facing the element electrodes of the light-emitting element 1.

In the light-emitting device of the fourth embodiment, element electrode connection portions of the light-emitting element are provided, for example, in the portions where the element connection electrodes 113a and 113b are exposed, i.e., in the positions corresponding to the openings 230a and 230b so as to have substantially the same size as the opening

230a, 230b. The element electrode connection portions are connected to the element connection electrodes via bumps formed in portions of the openings 230a and 230b where the element connection electrodes 113a and 113b are exposed.

Suppose that in the light-emitting device of the fourth embodiment, the light-emitting element includes, for example, a first conductive semiconductor layer, an active layer, and a second conductive semiconductor layer on a substrate in this order from the substrate side, and the light-emitting element is a flip-chip light-emitting element that includes a first conductive electrode connection portion and a second conductive electrode connection portion on the same plane of the substrate on the second conductive semiconductor layer side. In this case, the element electrode connection portions (the first conductive electrode connection portion and the second conductive electrode connection portion) of the light-emitting element are provided, for example, as follows.

First, the first conductive semiconductor layer, the active layer, and the second conductive semiconductor layer are stacked on the substrate for the light-emitting element. Thereafter, the first conductive semiconductor layer is exposed by removing portions, in which the first conductive electrode connection portions are to be formed, of the second conductive semiconductor layer and active layer above the first conductive semiconductor layer.

Then, the first conductive electrode connection portion is formed so as to contact the exposed first conductive semiconductor layer.

As mentioned above, the first conductive electrode connection portion is formed.

The second conductive electrode connection portion is formed at a predetermined position on the second conductive semiconductor layer.

It is noted that, for example, an insulating film is formed in an area excluding the first conductive electrode connection portion and the second conductive electrode connection portion on the second conductive semiconductor layer.

The first and second conductive electrode connection portions of the light-emitting element configured as mentioned above are connected to the exposed portions of the element connection electrodes 113a and 113b of the package via the bumps, respectively. In this way, the light-emitting element is mounted. The light-emitting element is a light-emitting element that has a peak wavelength in the range from 280 nm to 575 nm, preferably a light-emitting element that has a peak wavelength in the range from 280 nm to 410 nm, and particularly preferably a light-emitting element that has a peak wavelength in the range from 350 nm to 410 nm.

In the following, the method of manufacturing a light-emitting device of the fourth embodiment will be described focusing on differences from the method of manufacturing a light-emitting device of the third embodiment.

First of all, the method of manufacturing a light-emitting device of the fourth embodiment is the same as the method of manufacturing a light-emitting device of the third embodiment in that the preparation step of the method of manufacturing a ceramic member of the first embodiment includes 1-1 package preparation step and 1-2 distributed Bragg reflector film (insulating film) formation step.
Electrode Exposure Step of the Fourth Embodiment The electrode exposure step of the fourth embodiment is the same as the electrode exposure step of the third embodiment in that a laser beam is applied from above the distributed Bragg reflector film formed on the external connection electrodes 112a and 112b and from above the distributed Bragg reflector film formed on the element connection electrodes 113a and 113b, and that the laser beam passes through the distributed Bragg reflector film to be absorbed in each of the external connection electrodes 112a and 112b and the element connection electrodes 113a and 113b, thereby vaporizing and removing parts of the surfaces of the external connection electrodes 112a and 112b, as well as parts of the surfaces of the element connection electrodes 113a and 113b not to expose the ceramic base 111.

However, the electrode exposure step of the fourth embodiment differs from the electrode exposure step of the third embodiment in that laser ablation is performed so that the element connection electrodes 113a and 113b are exposed at a plurality of locations from the distributed Bragg reflector film 230.

For example, in the electrode exposure step of the fourth embodiment, on and off of the laser beam is controlled based on the position information on the openings 230a and 230b when the laser beam is applied from above the distributed Bragg reflector film formed on each of the element connection electrodes 113a and 113b.

For example, locations of the reflector film where the element connection electrodes 113a and 113b are to be exposed are converted to data by the XY coordinates on the plane of the element connection electrodes 113a and 113b or on the distributed Bragg reflector film 230. Based on the data, a laser beam is applied to the portions of the distributed Bragg reflector film where the element connection electrodes 113a and 113b are to be exposed, while stopping irradiation of the laser beam in the other portions.

According to the electrode exposure step of the fourth embodiment mentioned above, the openings 230a and 230b can be formed in the distributed Bragg reflector film 230 with high positional accuracy.

In the package fabricated as mentioned above, the bumps are formed on the element connection electrodes 113a and 113b exposed through the openings 230a and 230b, respectively, and the first and second conductive electrode connection portions of the light-emitting element are connected to the respective bumps while causing the bumps to face the first and second conductive electrode connection portions.

As mentioned above, the light-emitting element is mounted at a predetermined position on the package.
Modification 1

In the light-emitting device of a fourth embodiment above, the openings 230a and 230b have the same opening shape and area. However, the light-emitting device of the embodiment is not limited to a configuration in which the openings 230a and 230b have the same opening shape and area. The areas where the openings 230a and 230b are exposed can be selected by using laser ablation. For example, when the areas of the openings 230a and 230b are adjusted so as to increase the remaining area of the distributed Bragg reflector film 230, light from the light-emitting element can be efficiently reflected by the distributed Bragg reflector film 230, thereby improving the light extraction efficiency.

Figure 6:
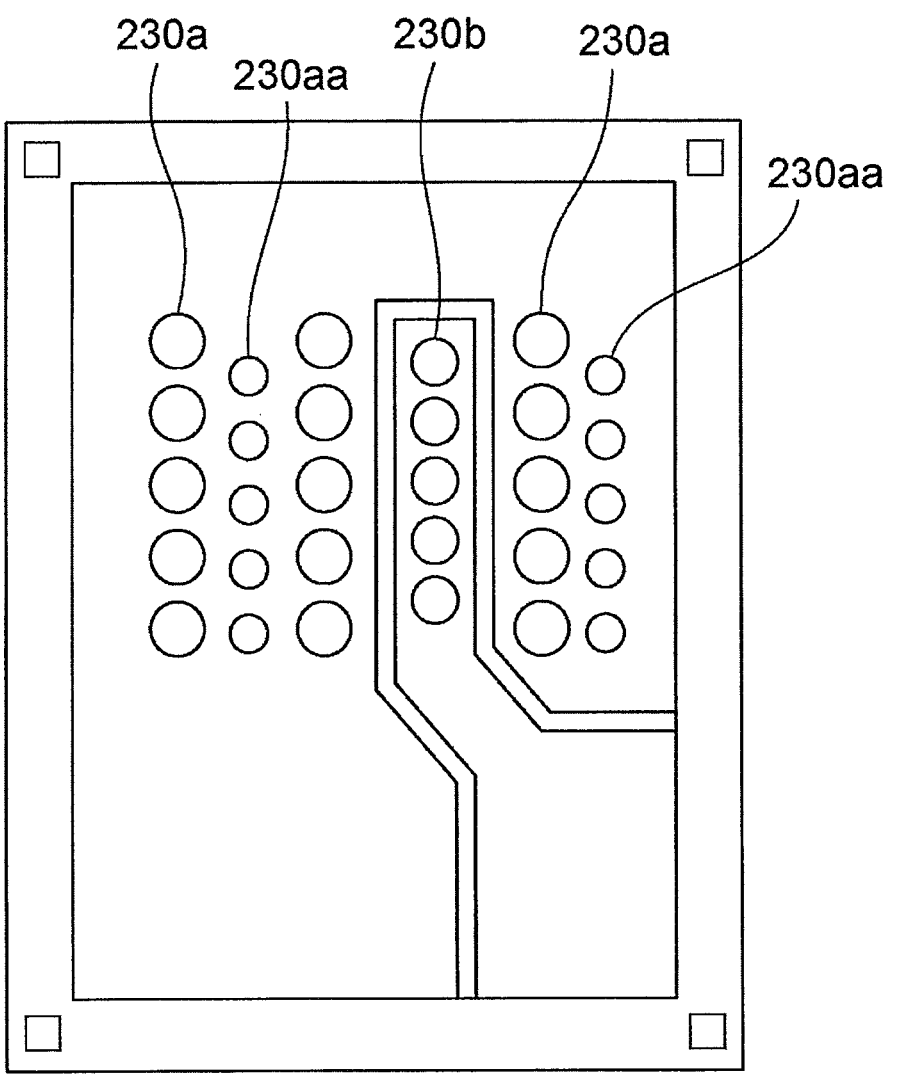
FIG. 6 is a top view of a package of a light-emitting device according to a first modification.

For example, as illustrated in FIG. 6, the opening through which the element connection electrode 113a is exposed may be constituted of two types of openings 230a and 230aa with different opening areas, or may be constituted of three or more types of openings with different opening areas.

Alternatively, the opening through which the element connection electrode 113a is exposed may be constituted of two types of openings with different shapes, and in this case, their opening areas may be different or the same from each other. The shape of the opening is not limited to a circular shape, but only needs to be any shape that can be realized by scanning with a laser, such as an elliptical, triangular, quadrangular, or other polygonal shape.

Modification 2

In the light-emitting device of the second embodiment, the external connection electrodes 12a and 12b are configured as the external connection electrodes 12a and 12b with the same shape as that illustrated in FIG. 2B. As in the light-emitting devices of the third and fourth embodiments, the external connection electrodes 112a and 112b are configured to have the same shape as illustrated in FIG. 4C. However, the two external connection electrodes of the light-emitting device of the embodiment may have different shapes and/or sizes.

Modification 3

Figure 7A:
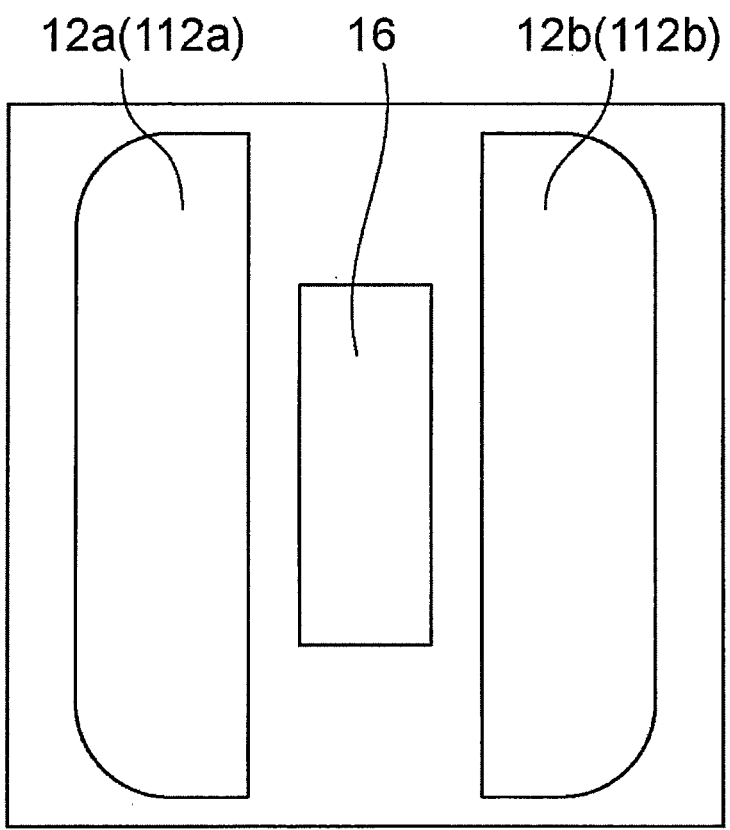
FIG. 7A is a bottom view of a light-emitting device according to a third modification.

The light-emitting devices of the second to fourth embodiments may have a heat dissipation portion 16 made of, for example, a metal with high thermal conductivity, between the two external connection electrodes 12a (112a) and 12b (112b), as illustrated in FIG. 7A.

The heat dissipation portion 16 may be made of the same or different metal from the external connection electrode 12a (112a) or 12b (112b).

Modification 4

Figure 7B:
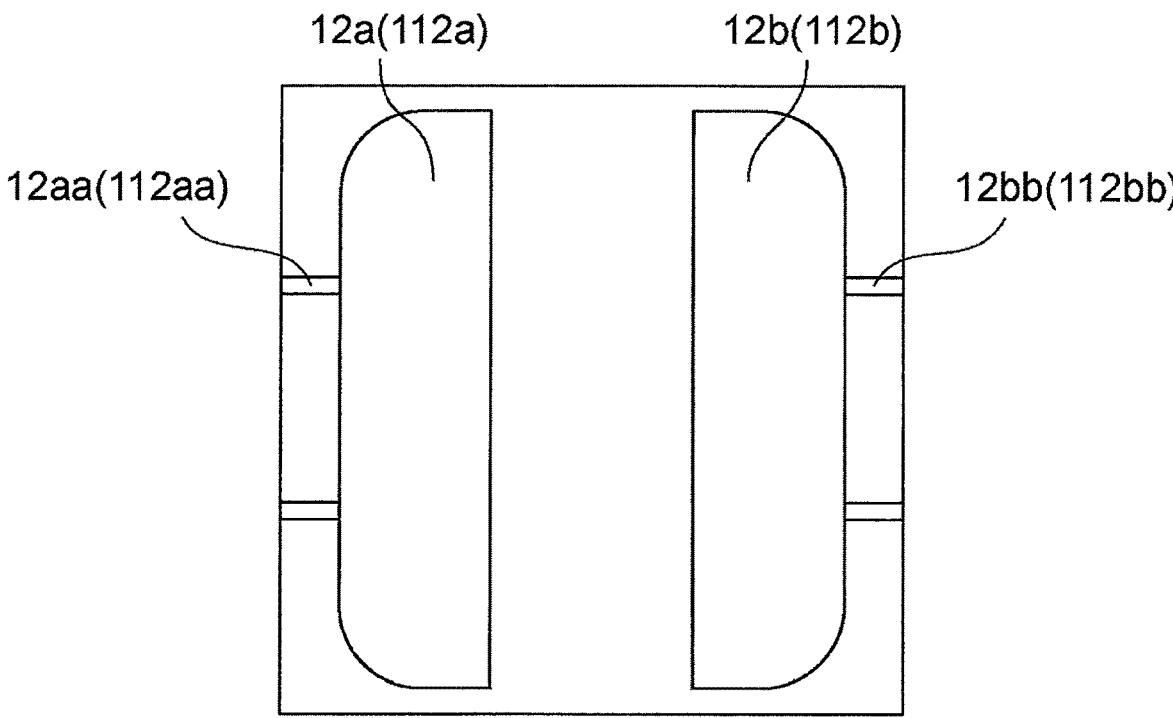
FIG. 7B is a bottom view of a light-emitting device according to a fourth modification.

In the light-emitting devices of the second to fourth embodiments, one or both of the external connection electrodes 12a (112a) and 12b (112b) may have an extending portion 12aa (112aa) and/or 12bb (112bb) as illustrated in FIG. 7B.

Modification 5

In the base members and light-emitting devices of the first to fourth embodiments, while the form in which the base is a ceramic body has been described, the base is not limited to the ceramic body, and may be a resin body made of glass epoxy or the like, which is inexpensive and versatile while having insulation from the electrodes or heat resistance. In addition, for the purpose of compensating for insufficient heat dissipation of the resin body, a conductive member with high thermal conductivity such as aluminum, silver, or copper, or an insulating member with high thermal conductivity such as aluminum nitride or silicon nitride may be affixed at the side of the lower surface of the resin body.

Fifth Embodiment

A base member, a light-emitting device, a method of manufacturing a base member, and a method of manufacturing a light-emitting device of a fifth embodiment will be described below. The light-emitting device of the fifth embodiment includes a plurality of light-emitting elements 301 on a base member 310. The base member 310 of the fifth embodiment is a base member 310 where the plurality of light-emitting elements 301 can be mounted and takes various forms as mentioned later.

First of all, a specific example of the light-emitting device of the fifth embodiment will be described herein with reference to FIGS. 9A and 9B.

Figure 9A:
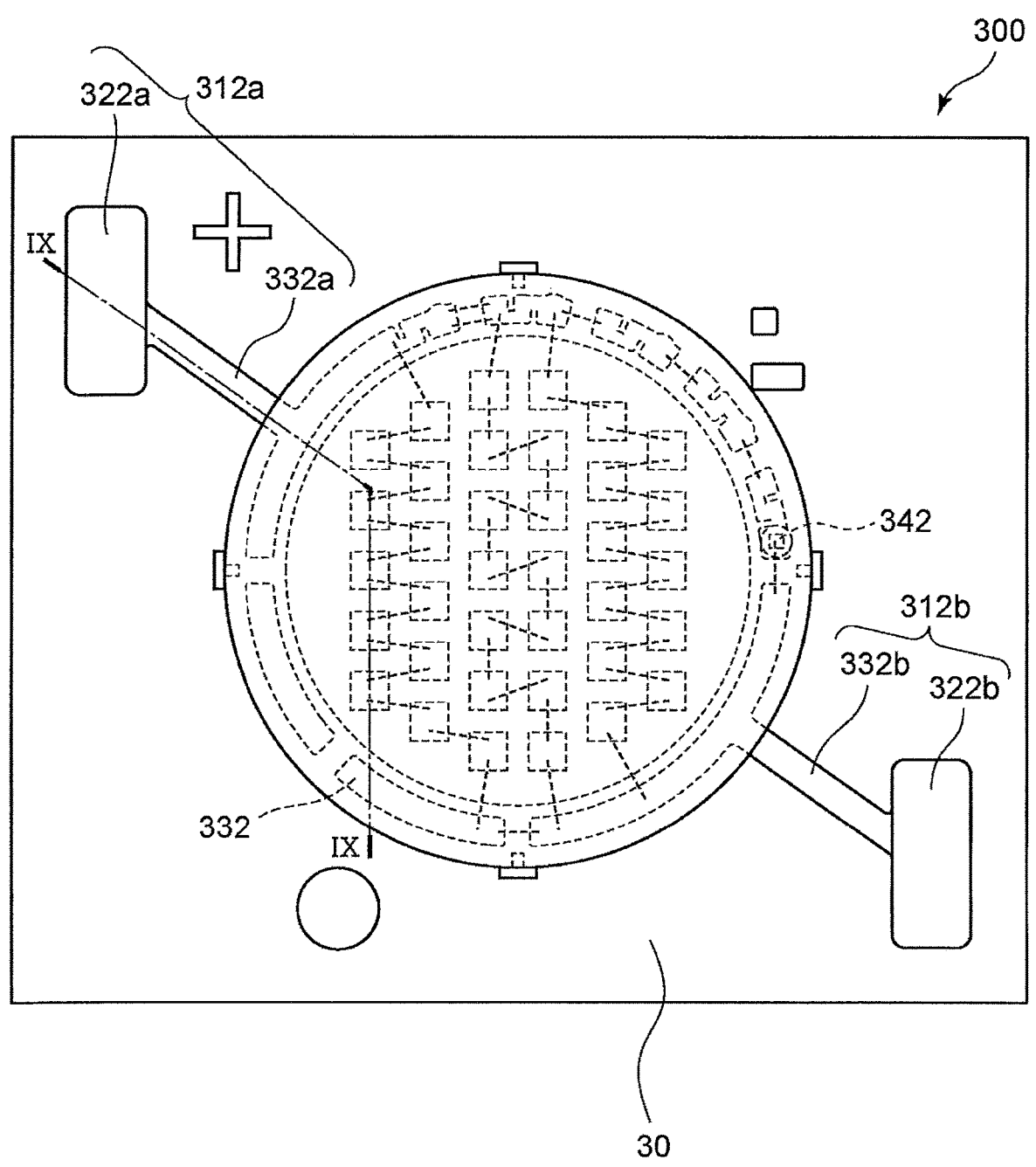
FIG. 9A is a top view of a package of a light-emitting device according to the fifth embodiment.

A light-emitting device 300 of FIG. 9A includes the base member 310 and the plurality of light-emitting elements 301 mounted on a first surface of the base member 310. The first surface of the base member 310 is provided with a positive electrode 312a and a negative electrode 312b, and the plurality of light-emitting elements 301 are connected between the positive electrode 312a and the negative electrode 312b. It is noted that in an example illustrated in FIG. 9A, 36 light-emitting elements 301 are included and divided into three groups, each group including 12 light-emitting elements 301, and these 12 light-emitting elements 301 in each group are connected in series. The positive electrode 312a includes a pad portion 322a, a drawn portion 332a connected to the pad portion 322a, and a connection portion connected to the drawn portion 332a, while the negative electrode 312b includes a pad portion 322b, a drawn portion 332b connected to the pad portion 322b, and a connection portion connected to the drawn portion 332b. A p-side element electrode of the light-emitting element 301 provided at the top of each group is connected to the connection portion of the positive electrode 312a, while an n-side element electrode of the light-emitting element 301 provided at the tail end of each group is connected to the connection portion of the negative electrode 312b. That is, between the positive electrode 312a and the negative electrode 312b, the three groups, each group including the 12 light-emitting elements 301 connected in series, are connected in parallel.

Here, the connection between the light-emitting elements 301 and the connection between each of the electrodes 312a and 312b of the base member 310 and the corresponding light-emitting element 301 are established by wire bonding. In examples illustrated in FIGS. 9A and 9B, the light-emitting element 301 is a face-up light-emitting element that includes an n-side element electrode and a p-side element electrode on its top surface, which is on the side of the light-emitting surface. The light-emitting device illustrated in FIGS. 9A and 9B has protective elements 342, such as Zener diodes, connected in parallel with the three groups connected in parallel. The light-emitting element as used herein will be described as being of the face-up type, but may be of a face-down type. That is, the light-emitting elements are face-down mounted on the base member, and then a frame is formed to enclose the light-emitting elements. Thereafter, the first and second surfaces of the base member, the frame, and the light-emitting elements are covered with an insulating film. A sealing member is disposed to cover the light-emitting elements within a mounting region enclosed by the frame. Then, laser irradiation is applied to the electrodes provided on the base member and covered with the insulating film, causing parts of the electrodes to be exposed. In this way, the light-emitting device using the face-down light-emitting elements can be provided.

Hereinafter, the base member and the light-emitting device of the fifth embodiment and its modifications will be described.

First of all, the base member will be described with reference to FIGS. 8A to 8D. Although the illustration of the light-emitting element is omitted herein, after the light-emitting elements are disposed on the base member, the light-emitting elements and the respective electrodes 312a and 312b are connected by wires, so that the light-emitting device can be manufactured. The connection between the light-emitting element and the electrode 312a, 312b can be performed by electrically connecting the element electrode of the light-emitting element to the corresponding pad portion 322a or drawn portion 332a of the electrode 312a outside the frame 350 enclosing the mounting regions of the light-emitting elements.

Alternatively, before disposing the light-emitting elements on the base member 310, the insulating film 30 is formed on the base and the electrodes by the atomic layer deposition method, and the laser irradiation is applied to the locations where the light-emitting elements are to be mounted, thereby partially removing the insulating film 30. The laser irradiation may be applied to portions of the insulating film 30 at locations where the wires are to be connected, thereby removing the portions of the insulating film 30. The light-emitting element is mounted above the electrodes with the insulating film 30 removed. Thereafter, the frame is formed so as to enclose the mounting region where the light-emitting elements are mounted. Then, a sealing member containing a phosphor is disposed inside the frame in the plan view, i.e., in the mounting region where the light-emitting elements are mounted. The insulating film may be formed again on the light-emitting elements before the sealing member is disposed, or the insulating film may be formed to cover the sealing member after the sealing member is disposed. This arrangement can make it difficult for moisture from the outside to reach the area where the first insulating film is removed. Finally, alternatively, before the sealing member is disposed, the insulating film 30 covering the electrodes where external terminals are to be connected, i.e., the pad portions, is removed by the laser irradiation. Also in this embodiment, the light-emitting device can be manufactured.

Figure 8A:
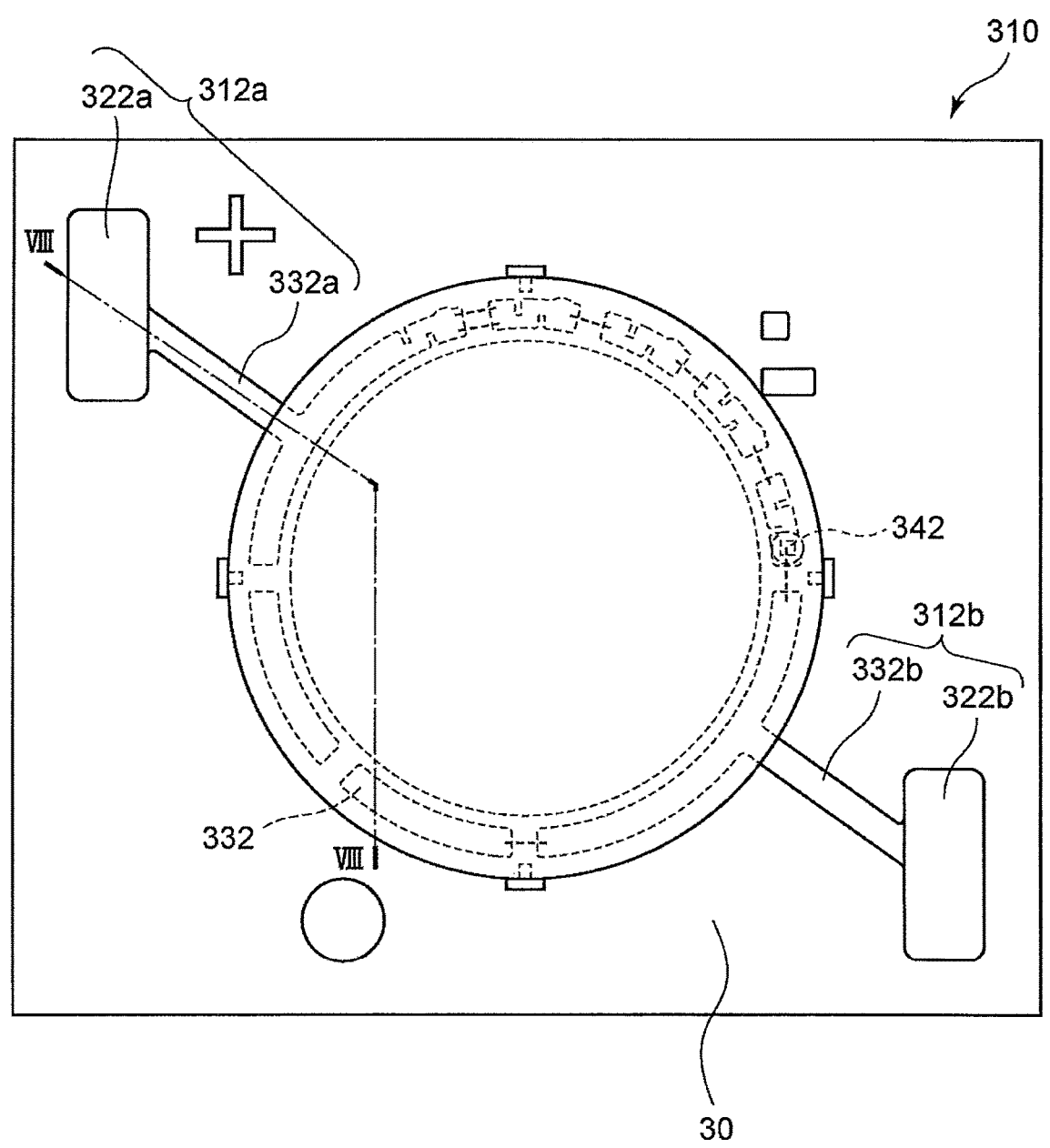
FIG. 8A is a top view of a base member according to a fifth embodiment.
Figure 8B:
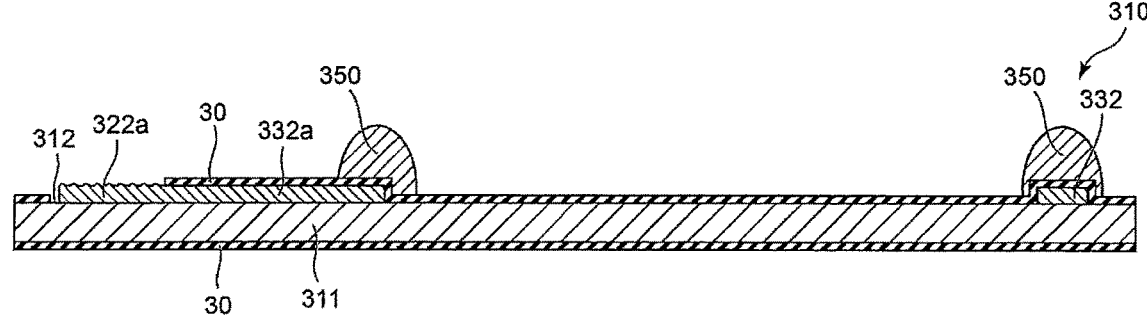
FIG. 8B is a cross-sectional view of the base member according to the fifth embodiment (a cross-sectional view taken along the line VIII-VIII in FIG. 8).
Figure 8C:
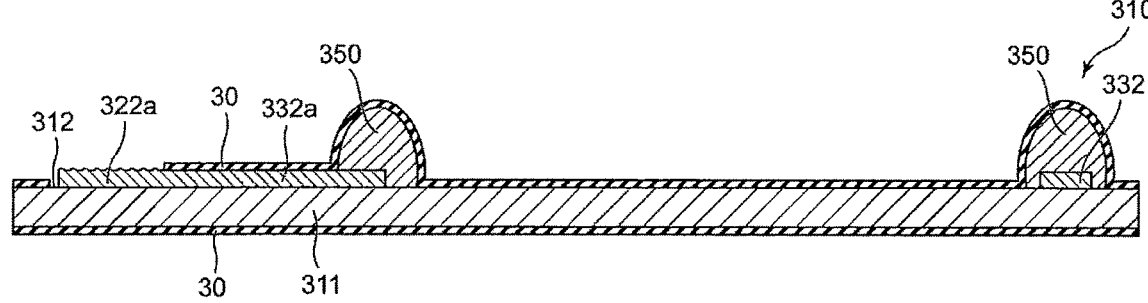
FIG. 8C is a cross-sectional view of a modification of the base member according to the fifth embodiment.
Figure 8D:
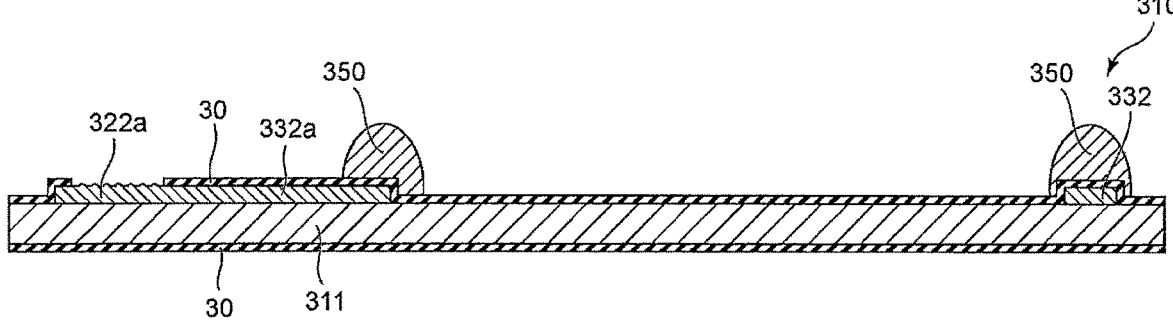
FIG. 8D is a cross-sectional view of a modification of the base member according to the fifth embodiment.
Figure 9B:
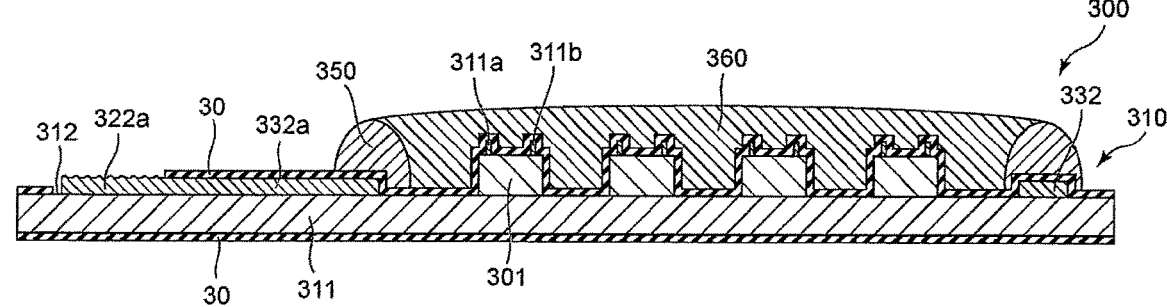
FIG. 9B is a cross-sectional view of a package of the light-emitting device according to the fifth embodiment (a cross-sectional view taken along the line IX-IX in FIG. 9A).

Here, the base member 310 illustrated in FIG. 8B can be formed using the same material as the base member used in the light-emitting device illustrated in FIGS. 9A and 9B, and base members illustrated in FIGS. 8C and 8D are its modifications. The base members 310 illustrated in FIGS. 8B, 8C, and 8D differ in the positional relationship between the frame 350 and the insulating film 30, the positional relationship between the pad portion and the insulating film 30, and the like, but they have the same electrode structure.

—Explanation of Base Member—

The base member 310 of this embodiment includes: a base 311 having a first surface and a second surface opposite the first surface; the electrodes 312a and 312b disposed on the first surface of the base 311; and the insulating film 30 covering the first and second surfaces of the base 311 and parts of the electrodes 312a and 312b.

The base 311 can be made of a material selected from a ceramic body or a resin body such as glass epoxy. As mentioned above, a member with high thermal conductivity may be affixed to the base 311 from the viewpoint of heat dissipation.

The electrodes 312a and 312b are disposed on the first surface of the base 311. The pad portions 322a and 322b illustrated in FIG. 8A as one example are provided in pairs at opposite corners of the base 311. The drawn portions 332a and 332b are drawn out of the pad portions 322a and 322b, respectively, along the diagonal. For example, the pad portion 322a and the drawn portion 332a may serve as the positive electrode 312a, while the pad portion 322b and the drawn portion 332b may serve as the negative electrode 312b. The protective elements 342 for protection of the elements may be provided between the positive electrode 312a and the negative electrode 312b. Then, in the base member 310, the light-emitting elements can be mounted on the plane, which is the same plane as the first surface where the electrodes 312a and 312b are disposed. That is, the base member 310 of the fifth embodiment can be used as a face-up mounting member in which the electrodes 312a and 312b and the light-emitting elements are provided on the same plane.

The insulating film 30 may be formed by the atomic layer deposition method using, for example, aluminum oxide ($Al_2O_3$). By forming the insulating film 30 in the atomic layer deposition method, aluminum oxide can also come around to be formed on the second surface of the base 311. The insulating film 30 covers the drawn portion 332 (332a, 332b), but at least parts of the pad portions 322a and 322b are exposed from the insulating film 30. Here, the surface roughness of the pad portions 322a and 322b exposed from the insulating film 30 may be set greater than that of the drawn portion 332 (332a, 332b) covered with the insulating film 30. The surface roughness Ra of the pad portions 322a and 322b exposed from the insulating film 30 may be 0.3 µm or more and 30 µm or less, and preferably 0.3 µm or more and 3 µm or less. By roughening the surface of the pad portions 322a and 322b exposed from the insulating film 30 more than that of the drawn portion 332 (332a, 332b) covered with the insulating film 30 in this way, the adhesiveness between the pad portion 322a, 322b and solder can be enhanced when the pad portions 322a and 322b are electrically connected to the outside by the solder, for example. For example, a difference between the surface roughness Ra of the drawn portion 332a, 332b and the surface roughness Ra of the pad portion 322a, 322b is at least 0.1 µm or more, preferably 0.2 µm or more, and more preferably 0.5 µm or more. This can make the form in which the surfaces of pad portions 322a and 322b are roughened while smoothing the surfaces of the drawn portions 332a and 332b.

In a preferred embodiment, the base member 310 may be configured such that the surface of the base 311 is exposed around each of the pad portions 322a and 322b and that the surface roughness of the exposed surface of the base 311 is set greater than the surface roughness of the surface of the base 311 covered with the insulating film 30. That is, in FIGS. 8B and 8C, the surface roughness of a base exposed portion 312 around the pad portion 322a, 322b is greater than that of the base 311 covered with the insulating film 30. By roughening the surface of the base exposed portion 312, the wettability and spread of solder can be suppressed, making it easier for the solder to return to the pad portion side. Therefore, the solder can be easily retained on the pad portion when performing solder-bonding onto the pad portions 322a and 322b.

Instead of the form in which the entire pad portions 322a and 322b are exposed from the insulating film 30, parts of the pad portions 322a and 322b may be exposed from the insulating film 30 (FIG. 8D). In this case, the surface roughness of the surfaces of the pad portions 322a and 322b exposed from the insulating film 30 is set greater than the surface roughness of the pad portions 322a and 322b not exposed from the insulating film 30, i.e., the surface roughness of the pad portions 322a and 322b covered with the insulating film 30. Even in such an embodiment, the adhesiveness between the pad portion 322a, 322b and solder can be enhanced when the pad portions 322a and 322b are electrically connected to the outside by the solder, for example.

In a preferred embodiment, the base member 310 may include the frame 350 to enclose the mounting region where the light-emitting elements are mounted. In FIG. 8A illustrating an example of the frame 350, the frame 350 has a circular shape in the plan view, but it may also have a polygonal shape, such as a square, pentagon, hexagon, or octagon, or ellipse. One frame may be divided into two or more parts, such as semicircular, fan-shaped, triangle, or rectangle parts, or it may be provided by combining a plurality of frame pieces. That is, the number of mounting regions enclosed by the frame in one light-emitting device is not limited to one, but the light-emitting device may have a plurality of mounting regions. Phosphors showing different emission colors may be disposed as appropriate across the plurality of mounting regions. This can achieve various emission colors through toning. The frame 350 may be made of a thermosetting resin, such as silicone resin, epoxy resin, or modified silicone resin. Furthermore, aluminum oxide, titanium oxide, silicon oxide or the like may be mixed in the thermosetting resin. For example, when manufacturing a light-emitting device including light-emitting elements inside the frame 350, light emitted from the light-emitting element toward its side can be reflected off the frame 350 to be output upward by mixing aluminum oxide, titanium oxide, etc., in the thermosetting resin, which can enhance the light extraction efficiency of the light-emitting device.

In a preferred embodiment, the frame 350 may be provided on the insulating film 30 (FIG. 8B). By forming the frame 350 on the insulating film 30, the adhesiveness of the frame can be improved. In addition, when the frame 350 is formed on the insulating film 30 formed by the atomic layer deposition method, the dense insulating film formed by the atomic layer deposition method has its surface flattened, making it less likely for the resin of the frame to spread (to bleed), so that the edge of the frame 350 can be sharpened. Thus, compared to the case where the frame 350 is formed on a base not covered with the insulating film, the formation of the frame 350 on the base covered with the insulating film can increase the ratio of the height to width of the frame 350. In other words, the formation of the frame 350 on the base covered with the insulating film can achieve the formation of a higher frame with a narrower width.

Instead of the form in which the frame 350 is formed on the insulating film mentioned above, the insulating film 30 may be provided after the frame 350 is formed (FIG. 8C).

Next, the light-emitting device including the base member mentioned above will be described.

—Explanation of Light Emitting Device—

The light-emitting device 300 of the present embodiment includes the base member 310 mentioned above and the light-emitting elements 301 provided in the mounting region. The mounting region provided in the base member 310 refers to a region enclosed by and located in the frame 350 in the plan view.

The plurality of light-emitting elements 301 is disposed in the mounting region of the light-emitting device 300 in FIG. 9A, which illustrates one specific example mentioned above. Adjacent light-emitting elements 301 are electrically connected together by conductive members 311a and 311b. In this specific example, the conductive members 311a and 311b are wires, and the n-side element electrode and p-side element electrode between the face-up mounted light-emitting elements are connected by wire bonding. The conductive members 311a and 311b are conductive wires with low electrical resistance and easy processability, such as gold, silver, copper, aluminum, or alloys thereof, for example. When using a conductive wire, the wire is preferably protected by a thermosetting sealing resin, such as silicone resin, epoxy resin, or modified silicone resin, or the like. Although in the light-emitting device 300 of a specific example illustrated in FIGS. 9A and 9B, conductive wires are used for the conductive members 311a and 311b, an element provided with an n-side element electrode and a p-side element electrode on its surface opposite to the light-emitting surface may be used as the light-emitting element and flip-chip mounted.

In the light-emitting device 300 of the present embodiment, as mentioned in the above explanation of the base member, the surface roughness of the pad portions 322a and 322b exposed from the insulating film 30 is set greater than the surface roughness of the pad portions 322a and 322b covered with the insulating film 30, or the surface roughness of the surface of the drawn portion 332 (332a, 332b) covered with the insulating film 30, so that the adhesiveness between the pad portion 322a, 322b and the solder can be enhanced when the pad portions 322a and 322b are electrically connected to the outside, for example, by solder or the like.

Here, the surface roughness Ra of the pad portions 322a and 322b exposed from the insulating film 30 may be 0.3 μm or more and 30 μm or less, and preferably 0.3 μm or more and 3 μm or less.

In a preferable light-emitting device 300, the frame 350 may be provided around the plurality of light-emitting elements 301. The frame 350 may be pre-installed on the base member before mounting the light-emitting elements 301. Alternatively, after mounting the light-emitting elements 301 on the base member, which has no frame, the frame 350 may be provided around the light-emitting elements 301. FIGS. 9A and 9B illustrate a specific example of the light-emitting device which is fabricated by mounting the light-emitting elements 301 on the base member 310 not having a frame, and then providing the frame 350 around the light-emitting elements 301. The frame 350 may be made of a mixture of at least one of aluminum oxide, titanium oxide, or silicon oxide, etc., in the thermosetting resin as mentioned above. By providing the frame 350, light from the light-emitting element 301 can be reflected appropriately.

In a preferable light-emitting device 300, a sealing member 360 that seals the region enclosed by the frame 350 may be further provided. The sealing member 360 is a member that has electrical insulation and can transmit light emitted from the light-emitting element 301. The material for the sealing member 360 is preferably one that has fluidity before solidification, and the sealing member 360 can be easily formed by utilizing the fluidity of its material before solidification to apply the material and then curing it. As the material for the sealing member 360, a light-transmissive resin with a light transmittance of 70% or higher is preferably selected. Examples of the light-transmissive resin include silicone resins, modified silicone resins, epoxy resins, phenolic resins, polycarbonate resins, acrylic resins, TPX resins, a polynorbornene resin, or hybrid resins containing one or more of these resins. Among them, silicone resins are preferable because of their excellent heat and light resistance and low volume shrinkage after solidification. A dimethylsilicone resin is particularly preferable because of its excellent heat and light resistance.

The sealing member 360 may contain a phosphor that is excited by receiving light from the light-emitting element 301 and converts it to light with a different wavelength. A fluoride phosphor may be used as an example of the phosphor from the viewpoint of enhancing color rendering properties. Examples of the fluoride phosphor include $K_2SiF_6$:Mn (KSF phosphor) or $K_2(Si,Al)F_6$:Mn (KSAF phosphor). Here, in the formula representing the phosphor composition, elements constituting a host crystal and their molar ratios are shown before the colon (:), and an activating element is shown after the colon (:). The formula representing the phosphor composition represents that the plurality of elements listed while being separated by the comma (,) may contain at least one of these plurality of elements in the composition, or a combination of two or more of them. The phosphor contained in the sealing member is not limited to a fluoride phosphor, but other phosphors may also be used in accordance with the emission peak wavelength of the light-emitting element.

The sealing member 360 may also contain a light diffusion material (for example, an inorganic material such as titanium dioxide) that diffuses light over a wide range. By containing a light diffusion material, uneven luminescence in a light-emitting region can be suppressed.

Figure 9C:
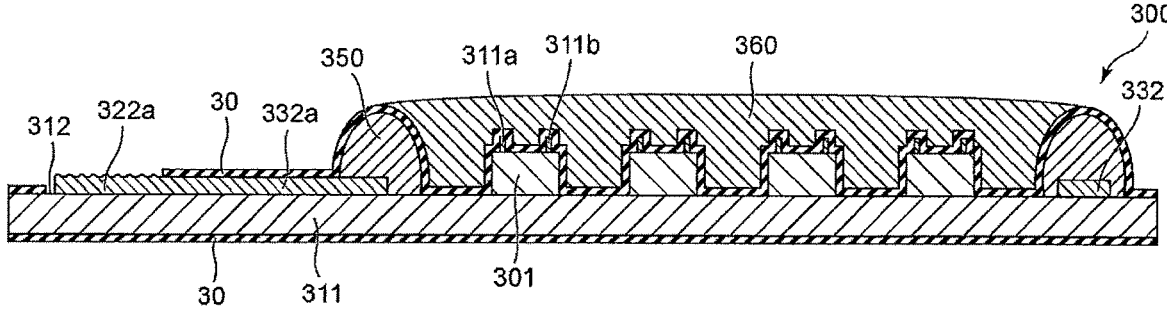
FIG. 9C is a cross-sectional view of a modification of the package of the light-emitting device according to the fifth embodiment.
Figure 9D:
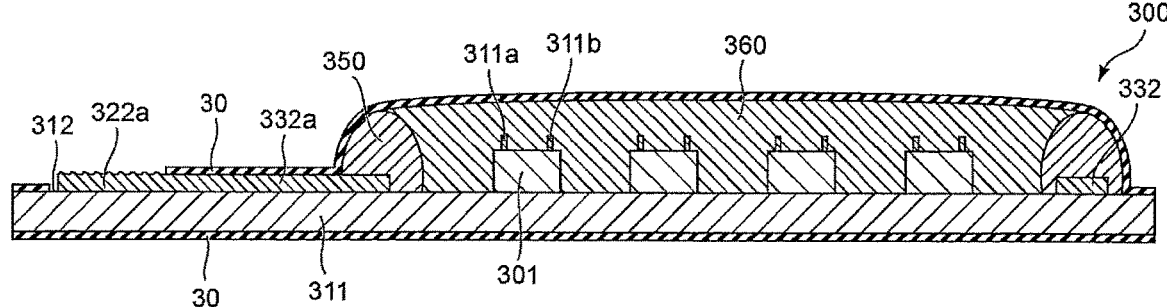
FIG. 9D is a cross-sectional view of a modification of the package of the light-emitting device according to the fifth embodiment.

In a preferable light-emitting device 300, the insulating film 30 may cover the frame 350 and/or sealing member 360. That is, unlike the form illustrated in FIG. 9B, the light-emitting device may be one in which the insulating film 30 covers the frame 350 as illustrated in FIG. 9C, or one in which the insulating film 30 covers the frame 350 and the sealing member 360 as illustrated in FIG. 9D. The covering form using such an insulating film 30 can reduce moisture from atmospheric humidity or the like entering the frame 350, the sealing member 360, and the light-emitting element 301.

Figure 9E:
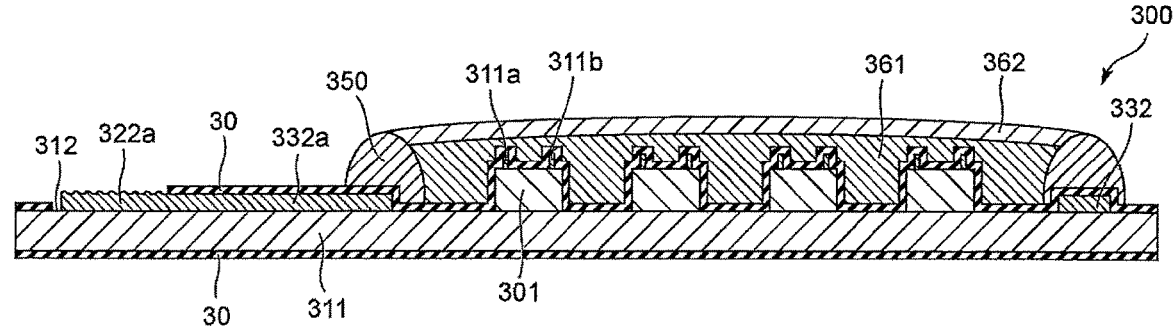
FIG. 9E is a cross-sectional view of a modification of the package of the light-emitting device according to the fifth embodiment.

Furthermore, a light-emitting device that reduces the moisture entering the light-emitting device may have a configuration in which a sealing member 362 is also provided outside the sealing member 360 in the light-emitting device illustrated in FIG. 9B. For example, the sealing member may be provided in the form of layers (e.g., two layers) as illustrated in FIG. 9E, with an outer sealing member 362 being formed using a material with lower moisture permeability than an inner sealing member 361.

Figure 9F:
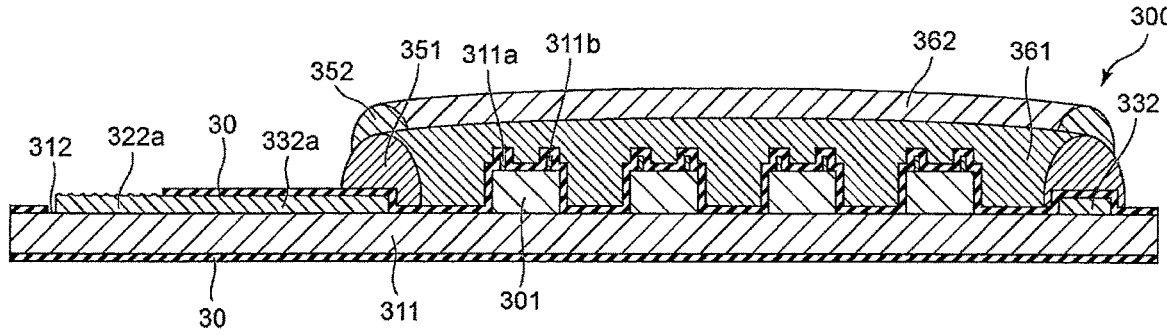
FIG. 9F is a cross-sectional view of a modification of the package of the light-emitting device according to the fifth embodiment.

In another light-emitting device, for example, another frame 352 and another sealing member 362 may further be disposed on the frame 351 and the sealing member 361 as illustrated in FIG. 9F, respectively, thereby reducing the moisture entering the light-emitting device. The phosphors with different emission colors may be contained and used in the respective sealing members 361 and 362. A phosphor emitting red light may be used as the phosphor contained in the sealing member 361. Examples thereof include a KSF phosphor, a KSAF phosphor, a CASN phosphor, a SCASN phosphor, and the like. A phosphor emitting either green or yellow light may be used as the phosphor contained in the sealing member 362. Examples thereof include a YAG phosphor, a silicate phosphor, G-LuAG, TAG, and the like.

Figure 9G:
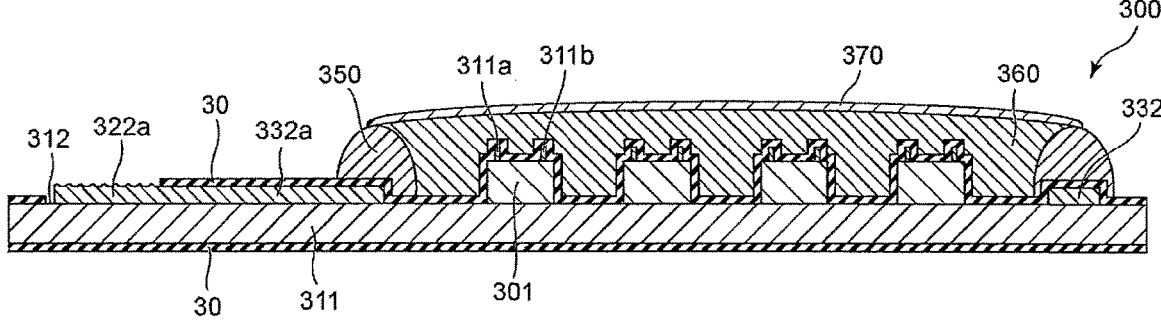
FIG. 9G is a cross-sectional view of a modification of the package of the light-emitting device according to the fifth embodiment.

In still another light-emitting device as illustrated in FIG. 9G, for example, a light-transmissive member 370 with lower moisture permeability may be disposed on the sealing member 360, thereby reducing the moisture entering the light-emitting device. Examples of the material for the light-transmissive member 370 with lower moisture permeability include glass, hydrophobic resins, and the like.

In a further light-emitting device, for example, the frame 350 and/or sealing member 360 may be further covered with an insulating film in the light-emitting device illustrated in FIG. 9B, thereby reducing the moisture entering the light-emitting device.

Next, the manufacturing methods of these devices will be described. First, the method of manufacturing a light-emitting device will be described.

—Explanation of Method of Manufacturing Light Emitting Device—

In the method of manufacturing the above-mentioned base member not including the frame in the light-emitting device 300 of the present embodiment, the preparation step includes: 2-1. pre-mounting step; 2-2. light-emitting element mounting step; and 2-3. insulating film formation step. The method of manufacturing a light-emitting device further includes a frame formation step of forming the frame 350 that encloses the light-emitting element 301.

Hereinafter, the method of manufacturing a light-emitting device of the present embodiment will be described in more detail.

2-1. Pre-Mounting Step

In the pre-mounting step, a structure is prepared which is provided with the electrodes 312a and 312b that include the pad portions 322a and 322b connected to the outside and the drawn portions 332 (332a, 332b) drawn out of the pad portions 322a and 322b, respectively.

2-2. Light-Emitting Element Mounting Step

In the light-emitting element mounting step, the light-emitting elements 301 are mounted in the mounting region of the base member 310 prepared in the pre-mounting step. In the light-emitting device illustrated in FIG. 9A by way of example, the plurality of light-emitting elements 301 are mounted in the mounting region, and the plurality of light-emitting elements 301 mounted are electrically connected to each other by using conductive wires.

2-3. Insulating Film Formation Step

In the insulating film formation step, the base member 310, the light-emitting elements 301, and the electrodes 312a and 312b are covered with the insulating film 30. The insulating film 30 is preferably formed by the atomic layer deposition method. The insulating film 30 may be formed of aluminum oxide by way of example.

After the above preparation steps (2-1. pre-mounting step, 2-2. light-emitting element mounting step, and 2-3. insulating film formation step), the electrode exposure step is performed.

<Electrode Exposure Step>

The electrode exposure step of the present embodiment is performed such that the pad portions 322a and 322b of the electrodes 312a and 312b are exposed from the insulating film 30. That is, the pad portions 322a and 322b are irradiated with the laser beam, thereby removing the insulating film 30 on the pad portions 322a and 322b. At this time, a pulsed laser is preferably used for the laser beam, and the pulse energy of the pulsed laser beam is set, for example, in the range from 1 µJ to 1,000 J, preferably 2 µJ to 300 µJ, more preferably 3 µJ to 100 µJ, and still more preferably 3 µJ to 10 µJ, inclusive. The pulse width of the laser beam is set, for example, in the range from 100 femtoseconds to 2,000 femtoseconds, preferably 100 femtoseconds to 1,000 femtoseconds, and more preferably 100 femtoseconds to 500 femtoseconds, inclusive.

Thus, in the electrode exposure step of the present embodiment, the pad portions 322a and 322b of the electrodes 312a and 312b are exposed from the surface of the insulating film 30, while the drawn portions 332 (332a, 332b) of the electrodes 312a and 312b are not exposed from the insulating film 30. Therefore, since the surface roughness of the pad portions 322a and 322b is greater than the surface roughness of the drawn portions 332 (332a, 332b), the adhesiveness between the pad portion 322a, 322b and solder can be enhanced when the pad portions 322a and 322b are electrically connected to the outside by the solder, for example.

In the electrode exposure step, the laser beam is preferably applied to an area larger than the area of the pad portions 322a and 322b in order to completely expose the pad portions 322a and 322b in the plan view. By setting the irradiation region for the laser beam in this way, the base exposed portion 312 where the base 311 is to be exposed can be formed. Since the surface roughness of the base exposed portion 312 is greater than the surface roughness of the surface of the base 311 covered with the insulating film 30, the surface wettability of the base exposed portion 312 is improved, and the solder can be easily retained on the pad portion when performing solder-bonding onto the pad portions 322a and 322b.

In the electrode exposure step, the laser beam is preferably applied such that the entire surfaces of the pad portions 322a and 322b can be scanned at least once in plan view. In other words, the pad portions 322a and 322b may have their surfaces roughened along the scanning direction of the laser beam. For example, the pad portions 322a and 322b may be grooved linearly in the same direction, or be grooved in a grid pattern.

In a preferable method of manufacturing a light-emitting element, it may include a frame formation step of forming the frame 350 that encloses the mounted light-emitting elements 301.

<Frame Formation Step>

The frame 350 may be made of a thermosetting resin, such as silicone resin, epoxy resin, or modified silicone resin, for example. Furthermore, aluminum oxide, titanium oxide, silicon oxide, etc., may be mixed in the thermosetting resin. The frame 350 may be formed, for example, by drawing while dispensing resin by a dispenser, a resin printing, transfer molding, or compression molding. By forming the frame 350 using such a method, when light is emitted from the light-emitting element mounted inside the frame 350, the light amount can be increased through the light reflection by the frame 350.

Here, the formation of the frame 350 may be performed after the formation of the insulating film 30. In this case, the insulating film 30 and the frame 350 have the positional relationship illustrated in, for example, FIG. 9B. By forming the frame 350 on the insulating film 30 in this way, the adhesiveness of the frame 350 thereto can be improved, compared to the case in which the frame is formed on a metal.

The frame 350 may be formed before the insulating film 30 is formed. In this case, the insulating film 30 and the frame 350 have the positional relationship illustrated in, for example, FIG. 9C. The insulating film 30 is formed on the frame 350 in this way, thereby making it possible to reduce moisture from the atmospheric humidity or the like entering the frame 350. For example, even if a phosphor susceptible to moisture is used and deteriorates, and a component of the phosphor leaches out, corrosion of the electrode can be suppressed.

A preferable method of manufacturing a light-emitting element may further include a sealing step of sealing a region enclosed by the frame 350 after the frame formation step.

<Sealing Step>

The sealing member 360 is preferably made of the light-transmissive resin mentioned above, and may further contain a phosphor (for example, a KSF phosphor or a KSAF phosphor), and/or a light diffusion material (for example, an inorganic material such as titanium oxide). Since the sealing member 360 before solidification has fluidity, it can be formed by supplying a fluid material into a region enclosed by the frame 350 and solidifying the material after the supply to seal the region. By sealing the mounting region with the sealing member 360 in this way, the light-emitting element 301 and the conductive wires or the like that electrically connect the light-emitting elements 301 can be protected. The inclusion of a phosphor or a light diffusion material in the sealing member 360 can enhance the emission performance of the light-emitting device.

Here, after the sealing step, the insulating film formation step and the electrode exposure step mentioned above may be performed. In this case, the insulating film 30, the frame 350, and the sealing member 360 have the positional relationship illustrated in FIG. 9D. The insulating film 30 is formed to cover the frame 350 and the sealing member 360 in this way, thereby making it possible to reduce moisture from atmospheric humidity or the like entering the frame 350 and the sealing member 360.

In another embodiment of the method of manufacturing a light-emitting device, the sealing step may use the sealing member 360 which is provided in the form of layers (e.g., two layers) to manufacture the light-emitting device (FIG. 9E) that uses, in the outer sealing member 360, the material with lower moisture permeability than the inner sealing member 360.

In another method of manufacturing a light-emitting device, after the sealing step, another frame formation step of forming another frame 350 on the sealing member and another sealing step of sealing a region enclosed by the other frame may be performed to manufacture the light-emitting device (FIG. 9F).

In another method of manufacturing a light-emitting device, after the sealing step, the light-transmissive member 370 (for example, glass, fluorine resin, etc.) with lower moisture permeability may be disposed directly on or indirectly over the sealing member, thereby manufacturing the light-emitting device (FIG. 9G) that reduces the moisture entering the light-emitting device.

While the methods for manufacturing a light-emitting device of the present embodiment (the method of manufacturing a light-emitting device that includes the base member and the light-emitting elements electrically connected to the electrodes) have been described above, the individual step elements of the above manufacturing methods may be used to constitute a "method of manufacturing a base member". That is, in the method of manufacturing a base member described in the fifth embodiment, the preparation step may include preparing a structure that includes electrodes having pad portions connected to the outside and the drawn portions drawn out of the pad portions, and the electrode exposure step may include exposing the pad portions 322a and 322b from the insulating film 30.

In the preparation step, a structure further including a frame enclosing the mounting region may be prepared. In the preparation step, the frame 350 (for example, the base member illustrated in FIG. 8B) may be formed after the formation of the insulating film 30. In the preparation step, the frame 350 (for example, the base member illustrated in FIG. 8C) may be formed before the formation of the insulating film 30.

While the embodiments of the present disclosure have been described above, the present disclosure is not limited to these embodiments. Various changes, additions, and other modifications can be made to the members as appropriate as long as they imply the technical concept of the present disclosure.

DESCRIPTION OF REFERENCE NUMERALS 100, 200, 300 Light-emitting device
1, 101, 301 Light-emitting element
1a, 1b Element electrode
311a, 311b Conductive member
2, 342 Protective element
10 Mounting substrate
11 Substrate
12a, 12b, 112a, 112b External connection electrode
12aa, 112aa, 12bb, 112bb Extending portion
13a, 13b, 113a, 113b Element connection electrode
14a, 14b, 114a, 114b Through-electrode
312a, 312b Electrode
322a, 322b Pad portion
332, 332a, 332b Drawn portion
16 Heat dissipation portion
21a, 21b Connection member 30 Insulating film
110 Package
111 Ceramic base
310 Base member
311 Base
312 Base exposed portion
350, 351, 352 Frame
360, 361, 362 Sealing member
370 Light-transmissive member
150 Light-transmissive lid
151 Spacer
230 Distributed Bragg reflector film
230a, 230b Opening
230A, 230B Opening

The invention claimed is:

1. A method of manufacturing a base member, the method comprising:

preparing a structure including a base having a first surface and a second surface opposite to the first surface, an electrode disposed on the first surface of the base, and an insulating film covering the first surface and the second surface of the base and the electrode; and exposing the electrode from the insulating film by irradiating the insulating film on the electrode with a laser light, wherein in the preparing of the structure, the insulating film comprises a distributed Bragg reflector comprising silicon oxide and niobium oxide, the insulating film is formed by alternately forming a first dielectric film made of $Nb_2O_5$ and a second dielectric film made of $SiO_2$ with different refractive indices, and the dielectric multilayer films have a reflectance of 70% or more in a range of 350 nm to 410 nm and a reflectance of 20% or less in a range of 500 nm to 535 nm, and in the exposing of the electrode, a peak wavelength of the laser beam is in a range from 500 nm or higher and 535 nm or lower when the laser beam is irradiated.

2. The method of manufacturing the base member according to claim 1, wherein a pulse energy of the laser beam is in a range from 1 μJ or higher and 1000 J or lower when the laser beam is irradiated.

3. The method of manufacturing the base member according to claim 1, wherein a pulse width of the laser beam is in a range from 100 femtoseconds or higher and 2,000 femtoseconds or lower when the laser beam is irradiated.

4. The method of manufacturing the base member according to claim 1, wherein an irradiation spot diameter of the laser beam is in a range from 15 μm or higher and 60 μm or lower when the laser beam is irradiated.

5. The method of manufacturing the base member according to claim 4, wherein the laser is scanned such that irradiation regions with the laser beam partly overlap each other.

6. The method of manufacturing the base member according to claim 1, wherein a surface of the electrode contains gold.

7. The method of manufacturing the base member according to claim 1, wherein the preparing of the structure includes the electrode having a pad portion connected to an outside and a drawn portion drawn out of the pad portion, and wherein the exposing of the electrode includes exposing the pad portion from the insulating film.

8. The method of manufacturing the base member according to claim 1, wherein the preparing of the structure includes preparing a structure further including a frame to enclose a mounting region of the base member.

9. The method of manufacturing the base member according to claim 8, wherein the preparing of the structure includes forming the frame after forming the insulating film.

10. The method of manufacturing the base member according to claim 8, wherein the preparing of the structure includes forming the frame before forming the insulating film.

11. A method of manufacturing a light-emitting device having the base member manufactured by the method of claim 1, further comprising:

mounting a light-emitting element to the base, wherein the preparing of the structure further includes, or after the exposing of the electrode, electrically connecting the electrode and the light-emitting element.

12. A method of manufacturing a light-emitting device according to claim 11, wherein the preparing of the structure further includes preparing an element connection electrode disposed on the second surface of the base and electrically connected to the electrode, and wherein the electrically connecting includes electrically connecting the element connecting electrode and the light emitting element.

13. The method of manufacturing a light-emitting device according to claim 11, the method further comprising:

forming a frame enclosing the light-emitting element.

14. The method of manufacturing a light-emitting device according to claim 13, the method further comprising sealing a region enclosed by the frame after the frame formation step.

* * * * *